United States Patent
Hopkins et al.

(10) Patent No.: US 12,542,257 B2
(45) Date of Patent: Feb. 3, 2026

(54) MINIMIZING REFLECTED POWER IN A TUNABLE EDGE SHEATH SYSTEM

(71) Applicant: Lam Research Corporation, Fremont, CA (US)

(72) Inventors: David Hopkins, Newark, CA (US); Bradford Lyndaker, San Ramon, CA (US); Alexei Marakhtanov, Albany, CA (US); Felix Kozakevich, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 303 days.

(21) Appl. No.: 17/908,785

(22) PCT Filed: Feb. 24, 2021

(86) PCT No.: PCT/US2021/019482
§ 371 (c)(1),
(2) Date: Sep. 1, 2022

(87) PCT Pub. No.: WO2021/178183
PCT Pub. Date: Sep. 10, 2021

(65) Prior Publication Data
US 2023/0102487 A1    Mar. 30, 2023

Related U.S. Application Data

(60) Provisional application No. 62/985,253, filed on Mar. 4, 2020.

(51) Int. Cl.
*H01J 37/32* (2006.01)

(52) U.S. Cl.
CPC .. *H01J 37/32137* (2013.01); *H01J 37/32174* (2013.01); *H01J 37/32183* (2013.01);
(Continued)

(58) Field of Classification Search
CPC .......................................... H01J 37/32–32642
See application file for complete search history.

(56) References Cited

U.S. PATENT DOCUMENTS

| 10,296,676 B2 * | 5/2019 | Howald ................ G06F 30/367 |
| 2012/0000888 A1 * | 1/2012 | Kawasaki ................ H03H 7/38 |
| | | 333/17.3 |

(Continued)

OTHER PUBLICATIONS

ISR & Written Opinion PCT/US2021/019482, dated Jun. 11, 2021, 9 pages.

*Primary Examiner* — Joshua L Allen
*Assistant Examiner* — Andrew Keelan Laobak
(74) *Attorney, Agent, or Firm* — Penilla IP, APC

(57) ABSTRACT

A method for controlling reflected power in a plasma processing system is provided, including: applying RF power from a first generator to an ESC; applying RF power from a second generator to an edge electrode that surrounds the ESC and is disposed below an edge ring that surrounds the ESC, the RF power from the second generator having a voltage set based on the amount of use of the edge ring, wherein the second generator automatically introduces a phase adjustment so that a phase of the RF power from the second generator substantially matches a phase of the RF power from the first generator; and, adjusting a variable capacitor of a match circuit through which the RF power from the second generator is applied to tune the phase adjustment to a target phase adjustment setting.

19 Claims, 8 Drawing Sheets

(52) U.S. Cl.
CPC .. *H01J 37/32532* (2013.01); *H01J 37/32642* (2013.01); *H01J 37/32935* (2013.01); *H01J 2237/334* (2013.01)

(56) References Cited

U.S. PATENT DOCUMENTS

| | | |
|---|---|---|
| 2017/0213753 A1 | 7/2017 | Rogers |
| 2018/0025891 A1* | 1/2018 | Marakhtanov .... H01J 37/32568 438/714 |
| 2019/0013184 A1* | 1/2019 | Cui .................. H01J 37/32183 |
| 2019/0088452 A1 | 3/2019 | Yamada et al. |
| 2019/0304752 A1 | 10/2019 | Kim |
| 2019/0363003 A1 | 11/2019 | Sarode Vishwanath |

* cited by examiner

MINIMIZING REFLECTED POWER IN A TUNABLE EDGE SHEATH SYSTEM

CLAIM OF PRIORITY

This application is a national stage filing of and claims priority, under 35 U.S.C. § 371, to PCT/US21/19482, filed on Feb. 24, 2021, and titled "MINIMIZING REFLECTED POWER IN A TUNABLE EDGE SHEATH SYSTEM", which claims benefit of and priority under 35 U.S.C. § 119(e), to Provisional Patent Application No. 62/985,253, filed on Mar. 4, 2020, titled "MINIMIZING REFLECTED POWER IN A TUNABLE EDGE SHEATH SYSTEM", the disclosures of which are incorporated by reference herein in their entirety.

BACKGROUND

1. Field of the Disclosure

The present disclosure relates to semiconductor device fabrication.

2. Description of the Related Art

Plasma etching processes are often used in the manufacture of semiconductor devices on semiconductor wafers. In the plasma etching process, a semiconductor wafer that includes semiconductor devices under manufacture is exposed to a plasma generated within a plasma processing volume. The plasma interacts with material(s) on the semiconductor wafer so as to remove material(s) from the semiconductor wafer and/or modify material(s) to enable their subsequent removal from the semiconductor wafer. The plasma can be generated using specific reactant gases that will cause constituents of the plasma to interact with the material(s) to be removed/modified from the semiconductor wafer, without significantly interacting with other materials on the wafer that are not to be removed/modified. The plasma is generated by using radiofrequency signals to energize the specific reactant gases. These radiofrequency signals are transmitted through the plasma processing volume that contains the reactant gases, with the semiconductor wafer held in exposure to the plasma processing volume. The transmission paths of the radiofrequency signals through the plasma processing volume can affect how the plasma is generated within the plasma processing volume. For example, the reactant gases may be energized to a greater extent in regions of the plasma processing volume where larger amounts of radiofrequency signal power is transmitted, thereby causing spatial non-uniformities in the plasma characteristics throughout the plasma processing volume. The spatial non-uniformities in plasma characteristics can manifest as spatial non-uniformity in ion density, ion energy, and/or reactive constituent density, among other plasma characteristics. The spatial non-uniformities in plasma characteristics can correspondingly cause spatial non-uniformities in plasma processing results on the semiconductor wafer. Therefore, the manner in which radiofrequency signals are transmitted through the plasma processing volume can have an effect on the uniformity of plasma processing results on the semiconductor wafer. It is within this context that the present disclosure arises.

SUMMARY

Broadly speaking, embodiments of the present disclosure provide methods and system to minimize reflected power in a tunable edge sheath (TES) system, whereby an edge electrode is independently powered, separate from the main electrode of the electrostatic chuck (ESC). Initially, the TES voltage setpoint is set. The TES RF generator automatically generates voltage to match the TES voltage setpoint by adjusting its RF output (i.e., by adjusting its power amplifier output).

The TES RF generator automatically determines phase delta, which is the phase difference between the 400 kHz signal from the primary RF generator and the 400 kHz signal from the TES RF generator. The TES RF generator automatically determines and sets its phase actuator position needed to minimize the phase delta (between the TES RF signal and the main RF signal) to zero or approximately zero. At this point, the TES RF generator is operating to generate a TES voltage as close as possible to the TES voltage setpoint, while also minimizing the phase delta. However, the TES RF generator does not make any adjustments to minimize reflected power (i.e., gamma).

In order to minimize the reflected power (gamma), a capacitor tap position in the TES system's match is adjusted. There will be a particular capacitor tap position at which the reflected power (gamma) is minimized. The capacitor tap position is adjusted in a step-wise manner until the minimum reflected power (gamma) is achieved. At each adjustment step of the capacitor tap, the TES RF generator automatically adjusts the power amplifier and the phase actuator position to maintain the setpoint voltage and to minimize the phase delta.

When the minimum reflected power (gamma) is achieved, the capacitor tap position search is complete. At this point, for the specified TES voltage setpoint, the TES RF generator will be operating its power amplifier and holding the phase actuator position as needed to both 1) achieve the TES voltage setpoint, and 2) minimize the phase delta, while simultaneously achieving minimum reflected power (gamma).

During the process, it may be necessary to adjust the TES setpoint voltage. For example, wear of the edge ring may require that the TES setpoint voltage be adjusted. When the TES setpoint voltage is adjusted, then the system parameters need to be changed to optimize for the above objectives. When the TES setpoint voltage is changed, the TES RF generator automatically adjusts the power amplifier and the phase actuator to maintain the setpoint voltage and to minimize the phase delta. However, this likely results in a reflected power (gamma) that is not minimized. Therefore, a new capacitor tap position must be found that minimizes the reflected power (gamma). The search for this new capacitor tap position can be performed in the same manner as described above.

Further, it has been unexpectedly discovered that for a given recipe (i.e., for a given chemistry, pressure, temperature, etc.), when the TES setpoint voltage is changed, and the capacitor tap position is set to minimize reflected power, then the phase actuator position which minimizes the phase delta remains substantially the same. Therefore, the phase actuator position (for which the reflected power is minimized) can define a target phase adjustment for any TES voltage setpoint for the given recipe, and the capacitor tap position can be optimized by automatically adjusting until the phase actuator position returns to the target phase adjustment.

In an example embodiment, a method for controlling reflected power in a plasma processing system is provided, including: applying RF power from a first generator to an ESC; applying RF power from a second generator to an edge electrode that surrounds the ESC and is disposed below an edge ring that surrounds the ESC, the RF power from the second generator having a voltage set based on the amount of use of the edge ring, wherein the second generator automatically introduces a phase adjustment so that a phase of the RF power from the second generator substantially matches a phase of the RF power from the first generator; and, adjusting a variable capacitor of a match circuit through which the RF power from the second generator is applied to tune the phase adjustment to a target phase adjustment setting.

In some implementations, the method further includes: determining an amount of use of the edge ring; and, if the amount of use of the edge ring reaches a target level, initiating adjusting the variable capacitor of the match circuit.

In some implementations, the target level and the target phase adjustment setting are captured via a user interface.

In some implementations, the target level varies according to one or more criteria.

In some implementations, the target phase adjustment setting defines a predefined phase adjustment amount by which the phase of the RF power from the second generator is adjusted.

In some implementations, the adjusting the variable capacitor to tune the phase adjustment includes performing stepwise tap adjustments to the variable capacitor until the phase adjustment has reached the target phase adjustment setting.

In some implementations, the phase adjustment is tuned to the target phase adjustment setting when the phase adjustment reaches the target phase adjustment setting or the phase adjustment is within a predefined range of the target phase adjustment setting.

In some implementations, adjusting the variable capacitor to tune the phase adjustment to the target phase adjustment setting minimizes reflection of the RF power to the second generator.

In some implementations, the target phase adjustment setting to minimize reflection of the RF power to the second generator remains substantially the same for changes in the voltage set based on an amount of use of the edge ring.

In some implementations, an amount of use of the edge ring is defined by at least one of a number of hours of RF exposure of the edge ring and the voltage of the RF power from the second generator set based on the number of hours of RF exposure.

In some implementations, a method for minimizing reflected power in a plasma processing system is provided, including: applying RF power from a first generator to an ESC; applying RF power from a second generator to an edge electrode that surrounds the ESC, the RF power from the second generator having a voltage set at a predefined first voltage, wherein the second generator introduces a phase adjustment at a predefined phase adjustment amount so that a phase of the RF power from the second generator substantially matches a phase of the RF power from the first generator; changing the voltage of the RF power from the second generator from the predefined first voltage to a predefined second voltage, wherein changing the voltage causes the phase adjustment to change from the predefined phase adjustment amount; and, responsive to changing the voltage, adjusting a capacitance of a match circuit through which the RF power from the second generator is applied to return the changed phase adjustment to the predefined phase adjustment amount.

In some implementations, the method further includes: determining an amount of use of an edge ring that is disposed on top of the edge electrode and surrounds the ESC; and, if the amount of use of the edge ring reaches a target level, initiating changing the voltage of the RF power from the second generator.

In some implementations, the target level and the predefined phase adjustment amount are captured via a user interface.

In some implementations, the target level varies according to one or more criteria.

In some implementations, the adjusting the capacitance of the match circuit includes performing stepwise tap adjustments to the capacitance until the changed phase adjustment has reached the predefined phase adjustment amount.

In some implementations, the phase adjustment is returned to the predefined phase adjustment amount when the phase adjustment reaches the predefined phase adjustment amount or the phase adjustment is within a predefined range of the predefined phase adjustment amount.

In some implementations, adjusting the capacitance to return the phase adjustment to the predefined phase adjustment amount minimizes reflection of the RF power to the second generator.

In some implementations, the predefined phase adjustment amount that minimizes reflection of the RF power to the second generator remains substantially the same for changes in the voltage set based on an amount of use of an edge ring.

In some implementations, the amount of use of the edge ring is defined by at least one of a number of hours of RF exposure of the edge ring and the voltage of the RF power from the second generator set based on the number of hours of RF exposure.

DETAILED DESCRIPTION

In the following description, numerous specific details are set forth in order to provide an understanding of embodiments of the present disclosure. It will be apparent, however, to one skilled in the art that embodiments the present disclosure may be practiced without some or all of these specific details. In other instances, well known process operations have not been described in detail in order not to unnecessarily obscure the present disclosure.

In plasma etching systems for semiconductor wafer fabrication, spatial variation of etching results across the semiconductor wafer can be characterized by radial etch uniformity and azimuthal etch uniformity. Radial etch uniformity can be characterized by the variation in etch rate as a function of radial position on the semiconductor wafer, extending outward from the center of the semiconductor wafer to the edge of the semiconductor wafer at a given azimuthal position on the semiconductor wafer. And, azimuthal etch uniformity can be characterized by the variation in etch rate as a function of azimuthal position on the semiconductor wafer, about the center of the semiconductor wafer, at a given radial position on the semiconductor wafer. In some plasma processing systems, such as in the system described herein, the semiconductor wafer is positioned on an electrode from which radiofrequency signals emanate to generate a plasma within a plasma generation region overlying the semiconductor wafer, with the plasma having characteristics controlled to cause a prescribed etching process to occur on the semiconductor wafer.

Figure 1:
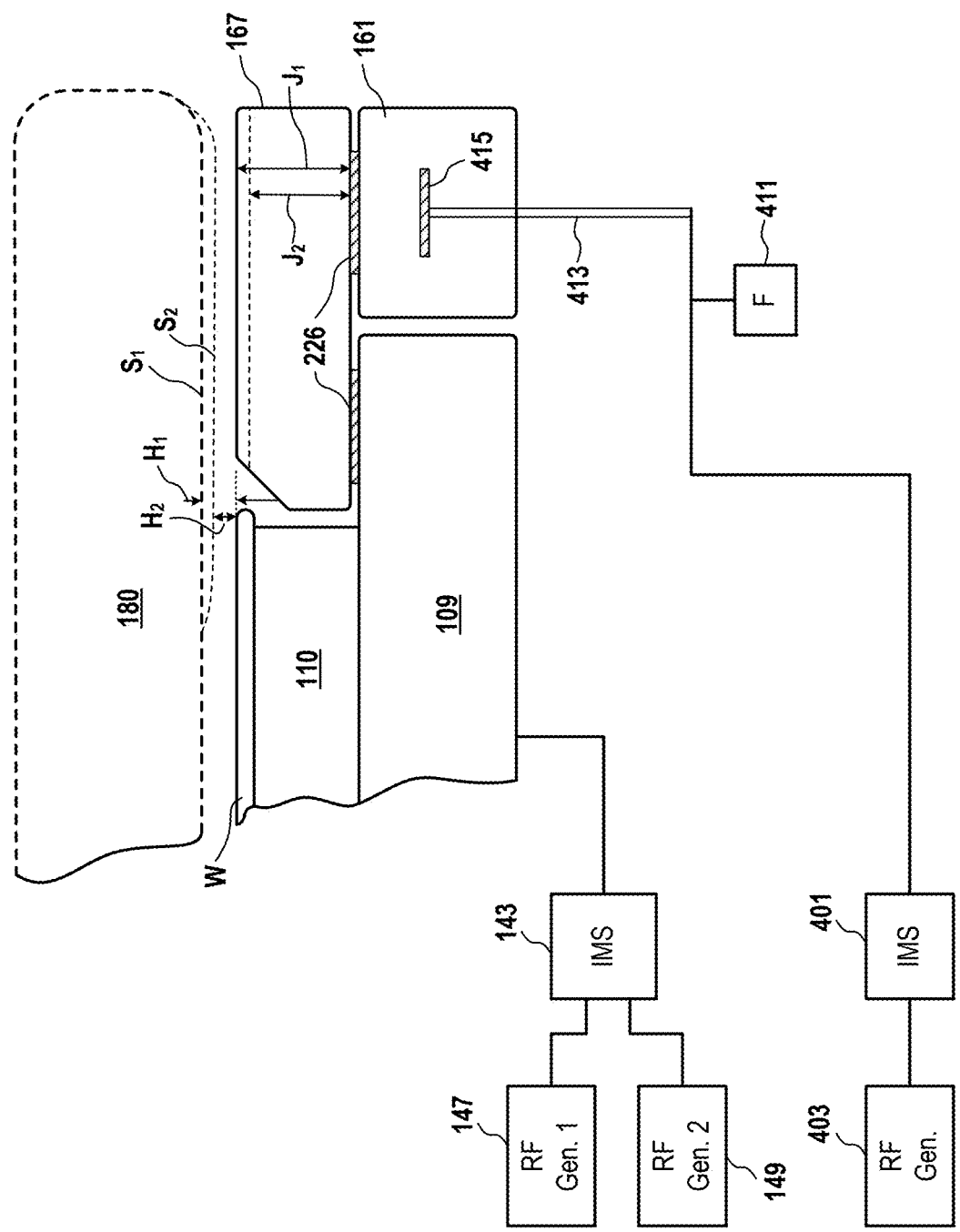
FIG. 1 shows a vertical cross-section view through a portion of a plasma processing system 100 for use in semiconductor chip manufacturing, in accordance with some embodiments.

FIG. 1 shows a vertical cross-section view through a portion of a plasma processing system 100 for use in semiconductor chip manufacturing, in accordance with some embodiments. The plasma processing system 100 includes an electrode 109 which in some embodiments, is formed of aluminum. A ceramic layer 110 is formed on a top surface of the electrode 109. The ceramic layer 110 is configured to receive and support the wafer W during performance of plasma processing operations on the wafer W. In some implementations the ceramic layer 110, the electrode 109, and associated components define an electrostatic chuck (ESC).

A first radiofrequency signal generator 147 (e.g. ~60 MHz) and a second radiofrequency signal generator 149 (e.g. ~400 kHz) provide radiofrequency power, via an impedance matching system 143, to the electrode 109. The application of radiofrequency power into gaseous species introduced in the process space above the wafer, produces plasma 180 for wafer processing, such as for etching.

An edge ring 167 surrounds the ceramic layer 110, and is configured to facilitate extension of a plasma sheath radially outward beyond the peripheral edge of the wafer W to provide improvement in process results near the periphery of the wafer W.

A Tunable Edge Sheath (TES) system is implemented to include a TES electrode 415 disposed (embedded) within a coupling ring 161. A TES radiofrequency signal generator 403 provide radiofrequency power through a TES impedance matching system 401 to the TES electrode 415. The TES system is capable of controlling characteristics of the plasma 180 near the peripheral edge of the wafer W, such as controlling properties of the plasma sheath, plasma density, and attracting or repelling ions. Broadly speaking, through the application of radiofrequency power to the TES electrode 415, the TES system enables tuning of the plasma at the edge of the wafer to improve radial uniformity.

For a given process recipe, parameters of the process recipe are set, including those for the TES system to provide radial uniformity. For example, in the illustrated implementation, for the edge ring 167 having a starting thickness J1, radiofrequency power is provided by the TES radiofrequency signal generator 403 at a first voltage V1, which is configured to tune the plasma sheath as indicated at S1, to have a height H1 above the top surface of the wafer W at the edge or peripheral region of the wafer W.

However, during plasma processing, the edge ring 167 is partially consumed or worn away, and thus the thickness of the edge ring 167 gradually decreases during its lifetime as RF hours and process cycles accumulate. Thus, for example, during the course of a number of RF hours, the thickness of the edge ring 167 may be reduced from thickness J1 to thickness J2. As the thickness of the edge ring 167 decreases, and with application of the voltage V1 during processing, then the level of the plasma sheath also drops. For example, when the thickness of the edge ring 167 wears down to thickness J2, then the plasma sheath lowers to a level as indicated at S2, so as to fall to a height H2 over the top surface of the wafer W at the wafer's edge.

This reduction in edge ring thickness and resulting change in the plasma sheath level at the wafer edge results in radial non-uniformity at the edge. For example, there may be differences in etch rate at the edge versus the central portion of the wafer (etch rate and etch depth non-uniformity), and feature profile tilting at the edge (etch directional non-uniformity).

Therefore, in order to counteract the effect of edge ring wear/consumption, and maintain the level of the plasma sheath despite loss of edge ring thickness, the voltage applied to the TES electrode 415 can be increased to a second voltage V2. In the illustrated implementation, when a voltage V2 (greater than voltage V1) is applied by the TES radiofrequency signal generator 403, and the edge sheath thickness has been reduced to thickness J2, then the plasma sheath is restored to that shown at reference S1. That is, even though the thickness of the edge ring 167 has been reduced, the level of the plasma sheath has been maintained through the application of increased voltage in the TES system.

However, increasing the voltage applied to the TES electrode 415 changes the impedance of the system, and causes increased reflection of radiofrequency power. In order to minimize reflected radiofrequency power, a capacitance setting in the TES impedance matching system 401 can be adjusted, as discussed in further detail below.

It is noted that the TES radiofrequency signal generator 403 is configured to automatically adjust the phase of its generated radiofrequency signal so as to match the phase of the radiofrequency signal generated by the radiofrequency signal generator 149 (e.g. at 400 kHz). Thus, when voltage applied to the TES electrode 415 is increased, then the TES radiofrequency signal generator 401 automatically adjusts to maintain phase matching with the radiofrequency signal from the radiofrequency signal generator 149. It has been discovered that the adjustment to the capacitance setting in the TES impedance matching system, which minimizes reflected radiofrequency power, is the adjustment to the capacitance setting which results in the phase adjustment by the TES radiofrequency signal generator 403 (which occurs automatically) returning substantially to its original phase adjustment amount for the original voltage (first voltage prior to being increased to compensate for edge ring wear). Thus, the phase adjustment amount can be utilized to optimize the capacitance setting in the TES impedance matching system.

Figure 2:
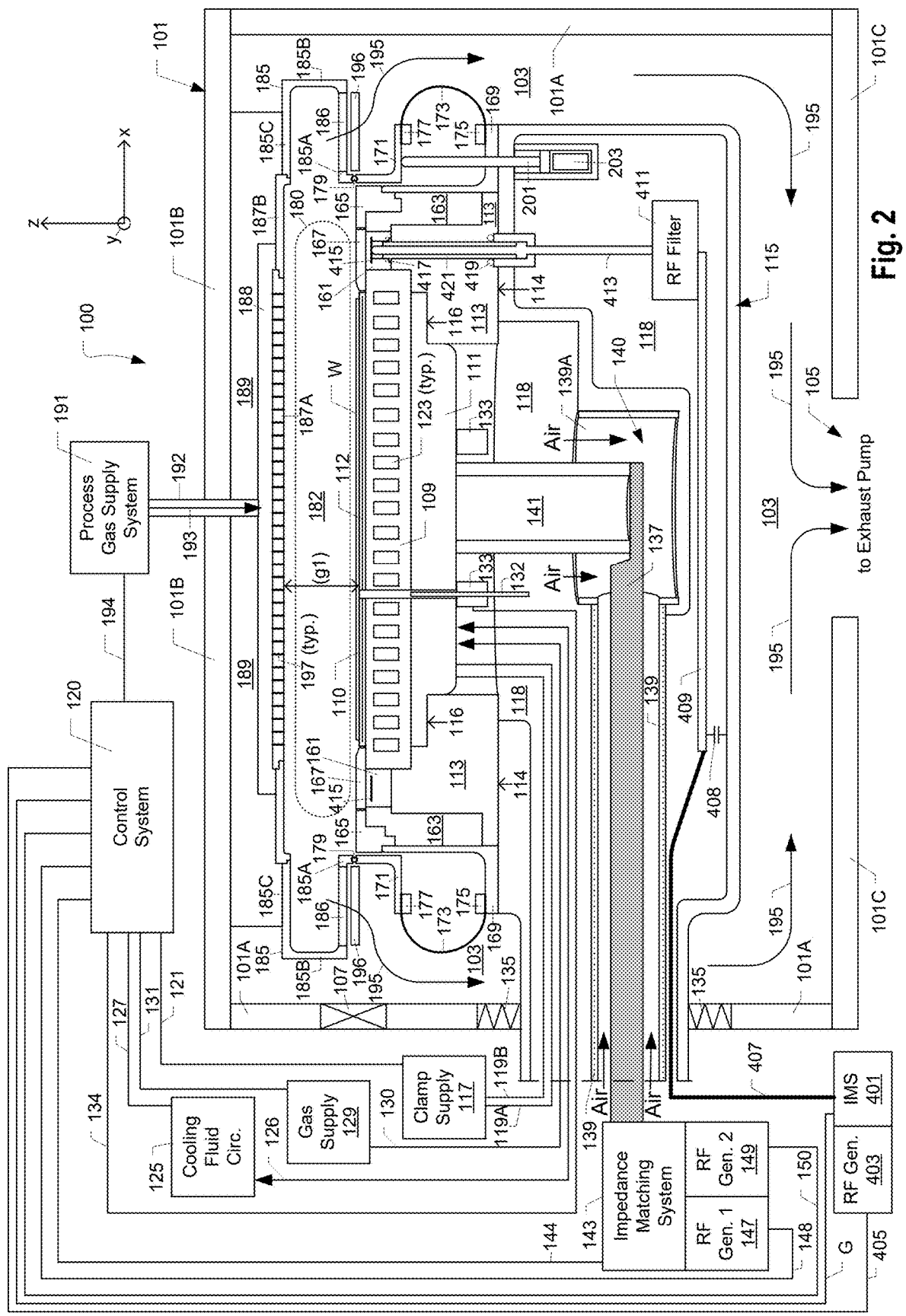
FIG. 2 shows a vertical cross-section view through a plasma processing system for use in semiconductor chip manufacturing, in accordance with some embodiments.

FIG. 2 shows a vertical cross-section view through a plasma processing system 100 for use in semiconductor chip manufacturing, in accordance with some embodiments. The system 100 includes a chamber 101 formed by walls 101A, a top member 101B, and a bottom member 101C. The walls 101A, top member 101B, and bottom member 101C collectively form an interior region 103 within the chamber 101. The bottom member 101C includes an exhaust port 105 through which exhaust gases from plasma processing operations are directed. In some embodiments, during operation, a suction force is applied at the exhaust port 105, such as by a turbo pump or other vacuum device, to draw process exhaust gases out of the interior region 103 of the chamber 101. In some embodiments, the chamber 101 is formed of aluminum. However, in various embodiments, the chamber 101 can be formed of essentially any material that provides sufficient mechanical strength, acceptable thermal performance, and is chemically compatible with the other materials to which it interfaces and to which it is exposed during plasma processing operations within the chamber 101, such as stainless steel, among others. At least one wall 101A of the chamber 101 includes a door 107 through which a semiconductor wafer W is transferred into and out of the chamber 101. In some embodiments, the door 107 is configured as a slit-valve door.

In some embodiments, the semiconductor wafer W is a semiconductor wafer undergoing a fabrication procedure. For ease of discussion, the semiconductor wafer W is referred to as wafer W hereafter. However, it should be understood that in various embodiments, the wafer W can be essentially any type of substrate that is subjected to a plasma-based fabrication process. For example, in some embodiments, the wafer W as referred to herein can be a substrate formed of silicon, sapphire, GaN, GaAs or SiC, or other substrate materials, and can include glass panels/substrates, metal foils, metal sheets, polymer materials, or the like. Also, in various embodiments, the wafer W as referred to herein may vary in form, shape, and/or size. For example, in some embodiments, the wafer W referred to herein may correspond to a circular-shaped semiconductor wafer on which integrated circuit devices are manufactured. In various embodiments, the circular-shaped wafer W can have a diameter of 200 mm (millimeters), 300 mm, 450 mm, or of another size. Also, in some embodiments, the wafer W referred to herein may correspond to a non-circular substrate, such as a rectangular substrate for a flat panel display, or the like, among other shapes.

The plasma processing system 100 includes an electrode 109 positioned on a facilities plate 111. In some embodiments, the electrode 109 and the facilities plate 111 are formed of aluminum. However, in other embodiments, the electrode 109 and the facilities plate 111 can be formed of another electrically conductive material that has sufficient mechanical strength and that has compatible thermal and chemical performance characteristics. A ceramic layer 110 is formed on a top surface of the electrode 109. In some embodiments, the ceramic layer has a vertical thickness of about 1.25 millimeters (mm), as measured perpendicular to the top surface of the electrode 109. However, in other embodiments, the ceramic layer 110 can have a vertical thickness that is either greater than or less than 1.25 mm. The ceramic layer 110 is configured to receive and support the wafer W during performance of plasma processing operations on the wafer W. In some embodiments, the top surface of the electrode 190 that is located radially outside of the ceramic layer 110 and the peripheral side surfaces of the electrode 109 are covered with a spray coat of ceramic.

The ceramic layer 110 includes an arrangement of one or more clamp electrodes 112 for generating an electrostatic force to hold the wafer W to the top surface of the ceramic layer 110. In some embodiments, the ceramic layer 110 includes an arrangement of two clamp electrodes 112 that operate in a bipolar manner to provide a clamping force to the wafer W. The clamp electrodes 112 are connected to a direct current (DC) supply 117 that generates a controlled clamping voltage to hold the wafer W against the top surface of the ceramic layer 110. Electrical wires 119A, 119B are connected between the DC supply 117 and the facilities plate 111. Electrical wires/conductors are routed through the facilities plate 111 and the electrode 109 to electrically connect the wires 119A, 119B to the clamp electrodes 112. The DC supply 117 is connected to a control system 120 through one or more signal conductors 121.

The electrode 109 also includes an arrangement of temperature control fluid channels 123 through which a temperature control fluid is flowed to control a temperature of the electrode 109 and in turn control a temperature of the wafer W. The temperature control fluid channels 123 are plumbed (fluidly connected) to ports on the facilities plate 111. Temperature control fluid supply and return lines are connected to these ports on the facilities plate 111 and to a temperature control fluid circulation system 125, as indicated by arrow 126. The temperature control fluid circulation system 125 includes a temperature control fluid supply, a temperature control fluid pump, and a heat exchanger, among other devices, to provide a controlled flow of temperature control fluid through the electrode 109 in order to obtain and maintain a prescribed wafer W temperature. The temperature control fluid circulation system 125 is connected to the control system 120 through one or more signal conductors 127. In various embodiments, various types of temperature control fluid can be used, such as water or a refrigerant liquid/gas. Also, in some embodiments, the temperature control fluid channels 123 are configured to enable spatially varying control of the temperature of the wafer W, such as in two dimensions (x and y) across the wafer W.

The ceramic layer 110 also includes an arrangement of backside gas supply ports (not shown) that are fluidly connected to corresponding backside gas supply channels within the electrode 109. The backside gas supply channels within the electrode 109 are routed through the electrode 109 to the interface between the electrode 109 and the facilities plate 111. One or more backside gas supply line(s) are connected to ports on the facilities plate 111 and to a backside gas supply system 129, as indicated by arrow 130. The facilities plate 111 is configured to supply the backside gas(es) from the one or more backside gas supply line(s) to the backside gas supply channels within the electrode 109. The backside gas supply system 129 includes a backside gas supply, a mass flow controller, and a flow control valve, among other devices, to provide a controlled flow of backside gas through the arrangement of backside gas supply ports in the ceramic layer 110. In some embodiments, the backside gas supply system 129 also includes one or more components for controlling a temperature of the backside gas. In some embodiments, the backside gas is helium. Also, in some embodiments, the backside gas supply system 129 can be used to supply clean dry air (CDA) to the arrangement of backside gas supply ports in the ceramic layer 110. The backside gas supply system 129 is connected to the control system 120 through one or more signal conductors 131.

Three lift pins 132 extend through the facilities plate 111, the electrode 109, and the ceramic layer 110 to provide for vertical movement of the wafer W relative to the top surface of the ceramic layer 110. In some embodiments, vertical movement of the lift pins 132 is controlled by a respective electromechanical and/or pneumatic lifting device 133 connected to the facilities plate 111. The three lifting devices 133 are connected to the control system 120 through one or more signal conductors 134. In some embodiments, the three lift pins 132 are positioned to have a substantially equal azimuthal spacing about a vertical centerline of the electrode 109/ceramic layer 110 that extends perpendicular to the top surface of the ceramic layer 110. It should be understood that the lift pins 132 are raised to receive the wafer W into the chamber 101 and to remove the wafer W from the chamber 101. Also, the lift pins 132 are lowered to allow the wafer W to rest on the top surface of the ceramic layer 110 during processing of the wafer W.

Also, in various embodiments, one or more of the electrode 109, the facilities plate 111, the ceramic layer 110, the clamp electrodes 112, the lift pins 132, or essentially any other component associated therewith can be equipped to include one or more sensors, such as sensors for temperature measurement, electrical voltage measurement, and electrical current measurement, among others. Any sensor disposed within the electrode 109, the facilities plate 111, the ceramic layer 110, the clamp electrodes 112, the lift pins 132, or essentially any other component associated therewith is connected to the control system 120 by way of electrical wire, optical fiber, or through a wireless connection.

The facilities plate 111 is set within an opening of a ceramic support 113, and is supported by the ceramic support 113. The ceramic support 113 is positioned on a supporting surface 114 of a cantilever arm assembly 115. In some embodiments, the ceramic support 113 has a substantially annular shape, such that the ceramic support 113 substantially circumscribes the outer radial perimeter of the facilities plate 111, while also providing a supporting surface 116 upon which a bottom outer peripheral surface of the facilities plate 111 rests. The cantilever arm assembly 115 extends through the wall 101A of the chamber 101. In some embodiments, a sealing mechanism 135 is provided within the wall 101A of the chamber 101 where the cantilever arm assembly 115 is located to provide for sealing of the interior region 103 of the chamber 101, while also enabling the cantilever arm assembly 115 to move upward and downward in the z-direction in a controlled manner.

The cantilever arm assembly 115 has an open region 118 through which various devices, wires, cables, and tubing is routed to support operations of the system 100. The open region 118 within the cantilever arm assembly is exposed to ambient atmospheric conditions outside of the chamber 101, e.g., air composition, temperature, pressure, and relative humidity. Also, a radiofrequency signal supply rod 137 is positioned inside of the cantilever arm assembly 115. More specifically, the radiofrequency signal supply rod 137 is positioned inside of an electrically conductive tube 139, such that the radiofrequency signal supply rod 137 is spaced apart from the inner wall of the tube 139. The sizes of the radiofrequency signal supply rod 137 and the tube 139 may vary. The region inside of the tube 139 between the inner wall of the tube 139 and the radiofrequency signal supply rod 137 is occupied by air along the full length of the tube 139. In some embodiments, the outer diameter ($D_{rod}$) of the radiofrequency signal supply rod 137 and the inner diameter of the tube 139 ($D_{tube}$) are set to satisfy the relationship $\ln(D_{tube}/D_{rod}) >= e^1$.

In some embodiments, the radiofrequency signal supply rod 137 is substantially centered within the tube 139, such that a substantially uniform radial thickness of air exists between the radiofrequency signal supply rod 137 and the inner wall of the tube 139, along the length of tube 139. However, in some embodiments, the radiofrequency signal supply rod 137 is not centered within the tube 139, but the air gap within the tube 139 exists at all locations between the radiofrequency signal supply rod 137 and the inner wall of the tube 139, along the length of the tube 139. A delivery end of the radiofrequency signal supply rod 137 is electrically and physically connected to a lower end of a radiofrequency signal supply shaft 141. In some embodiments, the delivery end of the radiofrequency signal supply rod 137 is bolted to a lower end of a radiofrequency signal supply shaft 141. An upper end of the radiofrequency signal supply shaft 141 is electrically and physically connected to the bottom of the facilities plate 111. In some embodiments, the upper end of the radiofrequency signal supply shaft 141 is bolted to the bottom of the facilities plate 111. In some embodiments, both the radiofrequency signal supply rod 137 and the radiofrequency signal supply shaft 141 are formed of copper. In some embodiments, the radiofrequency signal supply rod 137 is formed of copper, or aluminum, or anodized aluminum. In some embodiments, the radiofrequency signal supply shaft 141 is formed of copper, or aluminum, or anodized aluminum. In other embodiments, the radiofrequency signal supply rod 137 and/or the radiofrequency signal supply shaft 141 is formed of another electrically conductive material that provides for transmission of radiofrequency electrical signals. In some embodiments, the radiofrequency signal supply rod 137 and/or the radiofrequency signal supply shaft 141 is coated with an electrically conductive material (such as silver or another electrically conductive material) that provides for transmission of radiofrequency electrical signals. Also, in some embodiments, the radiofrequency signal supply rod 137 is a solid rod. However, in other embodiments, the radiofrequency signal supply rod 137 is a tube. Also, it should be understood that a region 140 surrounding the connection between the radiofrequency signal supply rod 137 and the radiofrequency signal supply shaft 141 is occupied by air.

A supply end of the radiofrequency signal supply rod 137 is connected electrically and physically to an impedance matching system 143. The impedance matching system 143 is connected to a first radiofrequency signal generator 147 and a second radiofrequency signal generator 149. The impedance matching system 143 is also connected to the control system 120 through one or more signal conductors 144. The first radiofrequency signal generator 147 is also connected to the control system 120 through one or more signal conductors 148. The second radiofrequency signal generator 149 is also connected to the control system 120 through one or more signal conductors 150. The impedance matching system 143 includes an arrangement of inductors and capacitors sized and connected to provide for impedance matching so that radiofrequency power can be transmitted along the radiofrequency signal supply rod 137, along the radiofrequency signal supply shaft 141, through the facilities plate 111, through the electrode 109, and into a plasma processing region 182 above the ceramic layer 110. In some embodiments, the first radiofrequency signal generator 147 is a high frequency radiofrequency signal generator, and the second radiofrequency signal generator 149 is a low frequency radiofrequency signal generator. In some embodiments, the first radiofrequency signal generator 147 generates radiofrequency signals within a range extending from about 50 MegaHertz (MHz) to about 70 MHz, or within a range extending from about 54 MHz to about 63 MHz, or at about 60 MHz. In some embodiments, the first radiofrequency signal generator 147 supplies radiofrequency power within a range extending from about 5 kiloWatts (kW) to about 25 kW, or within a range extending from about 10 kW to about 20 kW, or within a range extending from about 15 kW to about 20 kW, or of about 10 kW, or of about 16 kW. In some embodiments, the second radiofrequency signal generator 149 generates radiofrequency signals within a range extending from about 50 kiloHertz (kHz) to about 500 kHz, or within a range extending from about 330 kHz to about 440 kHz, or at about 400 kHz. In some embodiments, the second radiofrequency signal generator 149 supplies radiofrequency power within a range extending from about 15 kW to about 100 kW, or within a range extending from about 30 kW to about 50 kW, or of about 34 kW, or of about 50 kW. In an example embodiment, the first radiofrequency signal generator 147 is set to generate radiofrequency signals having a frequency of about 60 MHz, and the second radiofrequency signal generator 149 is set to generate radiofrequency signals having a frequency of about 400 kHz.

A coupling ring 161 is configured and positioned to extend around the outer radial perimeter of the electrode 109. In some embodiments, the coupling ring 161 is formed of a ceramic material. A quartz ring 163 is configured and positioned to extend around the outer radial perimeters of both the coupling ring 161 and the ceramic support 113. In some embodiments, the coupling ring 161 and the quartz ring 163 are configured to have substantially aligned top surfaces when the quartz ring 163 is positioned around both the coupling ring 161 and the ceramic support 113. Also, in some embodiments, the substantially aligned top surfaces of the coupling ring 161 and the quartz ring 163 are substantially aligned with a top surface of the electrode 109, said top surface being present outside of the radial perimeter of the ceramic layer 110. Also, in some embodiments, a cover ring 165 is configured and positioned to extend around the outer radial perimeter of the top surface of the quartz ring 163. In some embodiments, the cover ring 165 is formed of quartz. In some embodiments, the cover ring 165 is configured to extend vertically above the top surface of the quartz ring 163. In this manner, the cover ring 165 provides a peripheral boundary within which an edge ring 167 is positioned.

The edge ring 167 is configured to facilitate extension of the plasma sheath radially outward beyond the peripheral edge of the wafer W to provide improvement in process results near the periphery of the wafer W. In various embodiments, the edge ring 167 is formed of a conductive material, such as crystalline silicon, polycrystalline silicon (polysilicon), boron doped single crystalline silicon, aluminum oxide, quartz, aluminum nitride, silicon nitride, silicon carbide, or a silicon carbide layer on top of an aluminum oxide layer, or an alloy of silicon, or a combination thereof, among other materials. It should be understood that the edge ring 167 is formed as an annular-shaped structure, e.g., as a ring-shaped structure. The edge ring 167 can perform many functions, including shielding components underlying the edge ring 167 from being damaged by ions of a plasma 180 formed within a plasma processing region 182. Also, the edge ring 167 improves uniformity of the plasma 180 at and along the outer peripheral region of the wafer W.

A fixed outer support flange 169 is attached to the cantilever arm assembly 115. The fixed outer support flange 169 is configured to extend around an outer vertical side surface of the ceramic support 113, and around an outer vertical side surface of the quartz ring 163, and around a lower outer vertical side surface of the cover ring 165. The fixed outer support flange 169 has an annular shape that circumscribes the assembly of the ceramic support 113, the quartz ring 163, and the cover ring 165. The fixed outer support flange 169 has an L-shaped vertical cross-section that includes a vertical portion and a horizontal portion. The vertical portion of the L-shaped cross-section of the fixed outer support flange 169 has an inner vertical surface that is positioned against the outer vertical side surface of the ceramic support 113, and against the outer vertical side surface of the quartz ring 163, and against the lower outer vertical side surface of the cover ring 165. In some embodiments, the vertical portion of the L-shaped cross-section of the fixed outer support flange 169 extends over an entirety of the outer vertical side surface of the ceramic support 113, and over an entirety of the outer vertical side surface of the quartz ring 163, and over the lower outer vertical side surface of the cover ring 165. In some embodiments, the cover ring 165 extends radially outward above a top surface of the vertical portion of the L-shaped cross-section of the fixed outer support flange 169. And, in some embodiments, an upper outer vertical side surface of the cover ring 165 (located above the top surface of the vertical portion of the L-shaped cross-section of the fixed outer support flange 169) is substantially vertically aligned with an outer vertical surface of the vertical portion of the L-shaped cross-section of the fixed outer support flange 169. The horizontal portion of the L-shaped cross-section of the fixed outer support flange 169 is positioned on and fastened to the supporting surface 114 of a cantilever arm assembly 115. The fixed outer support flange 169 is formed of an electrically conductive material. In some embodiments, the fixed outer support flange 169 is formed of aluminum or anodized aluminum. However, in other embodiments, the fixed outer support flange 169 can be formed of another electrically conductive material, such as copper or stainless steel. In some embodiments, the horizontal portion of the L-shaped cross-section of the fixed outer support flange 169 is bolted to the supporting surface 114 of a cantilever arm assembly 115.

An articulating outer support flange 171 is configured and positioned to extend around the outer vertical surface 169D of the vertical portion of the L-shaped cross-section of the fixed outer support flange 169, and to extend around the upper outer vertical side surface of the cover ring 165. The articulating outer support flange 171 has an annular shape that circumscribes both the vertical portion of the L-shaped vertical cross-section of the fixed outer support flange 169 and the upper outer vertical side surface of the cover ring 165. The articulating outer support flange 171 has an L-shaped vertical cross-section that includes a vertical portion and a horizontal portion. The vertical portion of the L-shaped cross-section of the articulating outer support flange 171 has an inner vertical surface that is positioned proximate to and spaced apart from both the outer vertical side surface of the vertical portion of the L-shaped cross-section of the fixed outer support flange 169 and the upper outer vertical side surface of the cover ring 165. In this manner, the articulating outer support flange 171 is moveable in the vertical direction (z-direction) along both the vertical portion of the L-shaped vertical cross-section of the fixed outer support flange 169 and the upper outer vertical side surface of the cover ring 165. The articulating outer support flange 171 is formed of an electrically conductive material. In some embodiments, the articulating outer support flange 171 is formed of aluminum or anodized aluminum. However, in other embodiments, the articulating outer support flange 171 can be formed of another electrically conductive material, such as copper or stainless steel.

A number of electrically conductive straps 173 are connected between the articulating outer support flange 171 and the fixed outer support flange 169, around the outer radial perimeters of both the articulating outer support flange 171 and the fixed outer support flange 169. In the example embodiment, the electrically conductive straps 173 are shown to have an "outward" configuration, in that the electrically conductive straps 173 bend outward away from the fixed outer support flange 169. In some embodiments, the electrically conductive straps 173 are formed of stainless steel. However, in other embodiments, the electrically conductive straps 173 can be formed of another electrically conductive material, such as aluminum or copper, among others.

In some embodiments, forty-eight (48) electrically conductive straps 173 are distributed in a substantially equally spaced manner around the outer radial perimeters of the articulating outer support flange 171 and the fixed outer support flange 169. It should be understood, however, that the number of electrically conductive straps 173 can vary in different embodiments. In some embodiments, the number of electrically conductive straps 173 is within a range extending from about 24 to about 80, or within a range extending from about 36 to about 60, or within a range extending from about 40 to about 56. In some embodiments, the number of electrically conductive straps 173 is less than 24. In some embodiments, the number of electrically conductive straps 173 is greater than 80. Because the number of electrically conductive straps 173 has an effect on the ground return paths for the radiofrequency signals around the perimeter of the plasma processing region 182, the number of electrically conductive straps 173 can have an effect on the uniformity of process results across the wafer W. Also, the size of the electrically conductive straps 173 can vary in different embodiments.

In some embodiments, the electrically conductive straps 173 are connected to the fixed outer support flange 169 by a clamping force applied by securing a clamp ring 175 to a top surface of the horizontal portion of the L-shaped cross-section of the fixed outer support flange 169. In some embodiments, the clamp ring 175 is bolted to the fixed outer support flange 169. In some embodiments, the bolts that secure the clamp ring 175 to the fixed outer support flange 169 are positioned at locations between the electrically conductive straps 173. However, in some embodiments, one or more bolts that secure the clamp ring 175 to the fixed outer support flange 169 can be positioned to extend through electrically conductive straps 173. In some embodiments, the clamp ring 175 is formed of a same material as the fixed outer support flange 169. However, in other embodiments, the clamp ring 175 and the fixed outer support flange 169 can be formed of different materials.

In some embodiments, the electrically conductive straps 173 are connected to the articulating outer support flange 171 by a clamping force applied by securing a clamp ring 177 to a bottom surface of the horizontal portion of the L-shaped cross-section of the articulating outer support flange 171. Alternatively, in some embodiments, the first end portion of each of the plurality of electrically conductive straps 173 is connected to the upper surface of the horizontal portion of the articulating outer support flange 171 by the clamp ring 177. In some embodiments, the clamp ring 177 is bolted to the articulating outer support flange 171. In some embodiments, the bolts that secure the clamp ring 177 to the articulating outer support flange 171 are positioned at locations between the electrically conductive straps 173. However, in some embodiments, one or more bolts that secure the clamp ring 177 to the articulating outer support flange 171 can be positioned to extend through electrically conductive straps 173. In some embodiments, the clamp ring 177 is formed of a same material as the articulating outer support flange 171. However, in other embodiments, the clamp ring 177 and the articulating outer support flange 171 can be formed of different materials.

A set of support rods 201 are positioned around the cantilever arm assembly 115 to extend vertically through the horizontal portion 169B of the L-shaped cross-section of the fixed outer support flange 169. The upper end of the support rods 201 are configured to engage with the bottom surface of the horizontal portion of the L-shaped cross-section of the articulating outer support flange 171. In some embodiments, a lower end of each of the support rods 201 is engaged with a resistance mechanism 203. The resistance mechanism 203 is configured to provide an upward force to the corresponding support rod 201 that will resist downward movement of the support rod 201, while allowing some downward movement of the support rod 201. In some embodiments, the resistance mechanism 203 includes a spring to provide the upward force to the corresponding support rod 201. In some embodiments, the resistance mechanism 203 includes a material, e.g., spring and/or rubber, that has a sufficient spring constant to provide the upward force to the corresponding support rod 201. It should be understood that as the articulating outer support flange 171 moves downward to engage the set of support rods 201, the set of support rods 201 and corresponding resistance mechanisms 203 provide an upward force to the articulating outer support flange 171. In some embodiments, the set of support rods 201 includes three support rods 201 and corresponding resistance mechanisms 203. In some embodiments, the support rods 201 are positioned to have a substantially equal azimuthal spacing relative to a vertical centerline of the electrode 109. However, in other embodiments, the support rods 201 are positioned to have a non-equal azimuthal spacing relative to a vertical centerline of the electrode 109. Also, in some embodiments, more than three support rods 201 and corresponding resistance mechanisms 203 are provided to support the articulating outer support flange 171.

With continued reference back FIG. 2, the plasma processing system 100 further includes a C-shroud member 185 positioned above the electrode 109. The C-shroud member 185 is configured to interface with the articulating outer support flange 171. Specifically, a seal 179 is disposed on the top surface of the horizontal portion of the L-shaped cross-section of the articulating outer support flange 171, such that the seal 179 is engaged by the C-shroud member 185 when the articulating outer support flange 171 is moved upward toward the C-shroud member 185. In some embodiments, the seal 179 is electrically conductive to assist with establishing electrical conduction between the C-shroud member 185 and the articulating outer support flange 171. In some embodiments, the C-shroud member 185 is formed of polysilicon. However, in other embodiments, the C-shroud member 185 is formed of another type of electrically conductive material that is chemically compatible with the processes to be formed in the plasma processing region 182, and that has sufficient mechanical strength.

The C-shroud is configured to extend around the plasma processing region 182 and provide a radial extension of the plasma processing region 182 volume into the region defined within the C-shroud member 185. The C-shroud member 185 includes a lower wall 185A, an outer vertical wall 185B, and an upper wall 185C. In some embodiments, the outer vertical wall 185B and the upper wall 185C of the C-shroud member 185 are solid, non-perforated members, and the lower wall 185A of the C-shroud member 185 includes a number of vents 186 through which process gases flow from within the plasma processing region 182. In some embodiments, a throttle member 196 is disposed below the vents 186 of the C-shroud member 185 to control a flow of process gas through the vents 186. More specifically, in some embodiments, the throttle member 196 is configured to move up and down vertically in the z-direction relative to the C-shroud member 185 to control the flow of process gas through the vents 186. In some embodiments, the throttle member 196 is configured to engage with and/or enter the vents 186.

The upper wall 185C of the C-shroud member 185 is configured to support an upper electrode 187A/187B. In some embodiments, the upper electrode 187A/187B includes an inner upper electrode 187A and an outer upper electrode 187B. Alternatively, in some embodiments, the inner upper electrode 187A is present and the outer upper electrode 187B is not present, with the inner upper electrode 187A extending radially to cover the location that would be occupied by the outer upper electrode 187B. In some embodiments, the inner upper electrode 187A is formed of single crystal silicon and the outer upper electrode 187B is formed of polysilicon. However, in other embodiments, the inner upper electrode 187A and the outer upper electrode 187B can be formed of other materials that are structurally, chemically, electrically, and mechanically compatible with the processes to be performed within the plasma processing region 182. The inner upper electrode 187A includes a number of throughports 197 defined as holes extending through an entire vertical thickness of the inner upper electrode 187A. The throughports 197 are distributed across the inner upper electrode 187A, relative to the x-y plane, to provide for flow of process gas(es) from a plenum region 188 above the upper electrode 187A/187B to the plasma processing region 182 below the upper electrode 187A/187B.

It should be understood that the distribution of throughports 197 across the inner upper electrode 187A can be configured in different ways for different embodiments. For example, a total number of throughports 197 within the inner upper electrode 187A and/or a spatial distribution of throughports 197 within the inner upper electrode 187A can vary between different embodiments. Also, a diameter of the throughports 197 can vary between different embodiments. In general, it is of interest to reduce the diameter of the throughports 197 to a size small enough to prevent intrusion of the plasma 180 into the throughports 197 from the plasma processing region 182. In some embodiments, as the diameter of the throughports 197 is reduced, the total number of throughports 197 within the inner upper electrode 187A is increased to maintain a prescribed overall flowrate of process gas(es) from the process gas plenum region 188 through the inner upper electrode 187A to the plasma processing region 182. Also, in some embodiments, the upper electrode 187A/187B is electrically connected to a reference ground potential. However, in other embodiments, the inner upper electrode 187A and/or the outer upper electrode 187B is/are electrically connected to either a respective direct current (DC) electrical supply or a respective radiofrequency power supply by way of a corresponding impedance matching circuit.

The plenum region 188 is defined by an upper member 189. One or more gas supply ports 192 are formed through the chamber 101 and the upper member 189 to be in fluid communication with the plenum region 188. The one or more gas supply ports 192 are fluidly connected (plumbed) to a process gas supply system 191. The process gas supply system 191 includes one or process gas supplies, one or more mass flow controller(s), one or more flow control valve(s), among other devices, to provide controlled flow of one or more process gas(es) through the one or more gas supply ports 192 to the plenum region 188, as indicated by arrow 193. In some embodiments, the process gas supply system 191 also includes one or more components for controlling a temperature of the process gas(es). The process gas supply system 191 is connected to the control system 120 through one or more signal conductors 194.

A processing gap (g1) is defined as the vertical (z-direction) distance as measured between the top surface of the ceramic layer 110 and the bottom surface of the inner upper electrode 187A. The size of the processing gap (g1) can be adjusted by moving the cantilever arm assembly 115 in the vertical direction (z-direction). As the cantilever arm assembly 115 moves upward, the articulating outer support flange 171 eventually engages the lower wall 185A of the C-shroud member 185, at which point the articulating outer support flange 171 moves along the fixed outer support flange 169 as the cantilever arm assembly 115 continues to move upward until the set of support rods 201 engage the articulating outer support flange 171 and the prescribed processing gap (g1) size is achieved. Then, to reverse this movement for removal of the wafer W from the chamber, the cantilever arm assembly 115 is moved downward until the articulating outer support flange 171 moves away from the lower wall 185A of the C-shroud member 185. In various embodiments, the size of the processing gap (g1) during plasma processing of the wafer W is controlled with a range up to about 10 centimeters, or within a range up to about 8 centimeters, or within a range up to about 5 centimeters. It should be understood that FIG. 2 shows the system 100 in a closed configuration with the wafer W position on the ceramic layer 110 for plasma processing.

During plasma processing operations within the plasma processing system 100, the one or more process gas(es) are supplied to the plasma processing region 182 by way of the process gas supply system 191, plenum region 188, and throughports 197 within the inner upper electrode 187A. Also, radiofrequency signals are transmitted into the plasma processing region 182, by way of the first and second radiofrequency signal generators 147, 149, the impedance matching system 143, the radiofrequency signal supply rod 137, the radiofrequency signal supply shaft 141, the facilities plate 111, the electrode 109, and through the ceramic layer 110. The radiofrequency signals transform the process gas(es) into the plasma 180 within the plasma processing region 182. Ions and/or reactive constituents of the plasma interact with one or more materials on the wafer W to cause a change in composition and/or shape of particular material(s) present on the wafer W. The exhaust gases from the plasma processing region 182 flow through the vents 186 in the C-shroud member 185 and through the interior region 103 within the chamber 101 to the exhaust port 105 under the influence of a suction force applied at the exhaust port 105, as indicated by arrows 195.

In various embodiments, the electrode 109 can be configured to have different diameters. However, in some embodiments, to increase the surface of the electrode 109 upon which the edge ring 167 rests, the diameter of the electrode 109 is extended. In some embodiments, an electrically conductive gel 226 is disposed between a bottom of the edge ring 167 and the top of the electrode 109 and/or between the bottom of the edge ring 167 and the top of the coupling ring 161. In these embodiments, the increased diameter of the electrode 109 provides more surface area upon which the conductive gel is disposed between the edge ring 167 and the electrode 109.

It should be understood that the combination of the articulating outer support flange 171, the electrically conductive straps 173, and the fixed outer support flange 169 are electrically at a reference ground potential, and collectively form a ground return path for radiofrequency signals transmitted from the electrode 109 through the ceramic layer 110 into the plasma processing region 182. The azimuthal uniformity of this ground return path around the perimeter of the electrode 109 can have an effect on uniformity of process results on the wafer W. For example, in some embodiments, the uniformity of etch rate across the wafer W can be affected by the azimuthal uniformity of the ground return path around the perimeter of the electrode 109. To this end, it should be understood that the number, configuration, and arrangement of the electrically conductive straps 173 around the perimeter of the electrode 109 can affect the uniformity of process results across the wafer W.

With reference back to FIG. 2, a Tunable Edge Sheath (TES) system is implemented to include a TES electrode 415 disposed (embedded) within the coupling ring 161. The TES system also includes a number of TES radiofrequency signal supply pins 413 in physical and electrical connection with the TES electrode 415. Each TES radiofrequency signal supply pin 413 extends through a corresponding insulator feedthrough member 421 configured to electrically separate the TES radiofrequency signal supply pin 413 from surrounding structures, such as from the ceramic support 113 and the cantilever arm assembly 115 structure. In some embodiments, o-rings 417 and 419 are disposed to ensure that the region inside of the insulator feedthrough member 421 is not exposed to any materials/gases present within the plasma processing region 182. In some embodiments, the TES radiofrequency signal supply pins 413 are formed of copper, or aluminum, or anodized aluminum, among others.

The TES radiofrequency signal supply pins 413 extend into the open region 118 inside of the cantilever arm assembly 115, where each of the TES radiofrequency signal supply pins 413 is electrically connected to a TES radiofrequency signal supply conductor 409 through a corresponding TES radiofrequency signal filter 411. In some embodiments, three TES radiofrequency signal supply pins 413 are positioned to physically and electrically connect with the TES electrode 415 at substantially equally spaced azimuthal locations about the centerline of the electrode 109. It should be understood, however, that other embodiments can have more than three TES radiofrequency signal supply pins 413 in physical and electrical connection with the TES electrode 415. Also, some embodiments can have either one or two TES radiofrequency signal supply pins 413 in physical and electrical connection with the TES electrode 415. Each TES radiofrequency signal supply pin 413 is electrically connected to a corresponding TES radiofrequency signal filter 411, with each TES radiofrequency signal filter 411 electrically connected to the TES radiofrequency signal supply conductor 409. In some embodiments, each TES radiofrequency signal filter 411 is configured as an inductor. For example, in some embodiments, each TES radiofrequency signal filter 411 is configured as a coiled conductor, such as a metal coil wrapped around a dielectric core structure. In various embodiments, the metal coil can be formed of solid copper rod, copper tubing, aluminum rod, or aluminum tubing, among others. Also, in some embodiments, each TES radiofrequency signal filter 411 can be configured as a combination of inductive and capacitive structures. In the interest of improving plasma processing result uniformity across the wafer W, each of the TES radiofrequency signal filters 411 has a substantially same configuration.

In some embodiments, the TES radiofrequency signal supply conductor 409 is formed as a ring-shaped (annular-shaped) structure, so as to extend around the open region 118 inside of the cantilever arm assembly 115 to enable physical and electrical connection of the azimuthally distributed TES radiofrequency signal filters 411 with the TES radiofrequency signal supply conductor 409. In some embodiments, the TES radiofrequency signal supply conductor 409 is formed as a solid (non-tubular) structure. Alternatively, in some embodiments, the TES radiofrequency signal supply conductor 409 is formed as a tubular structure. In some embodiments, the TES radiofrequency signal supply conductor 409 is formed of copper, or aluminum, or anodized aluminum, among others.

The TES radiofrequency signal supply conductor 409 is electrically connected to a TES radiofrequency supply cable 407. Also, a capacitor 408 is connected between the TES radiofrequency signal supply conductor 409 and a reference ground potential, such as the structure of the cantilever arm assembly 115. More specifically, the capacitor 408 has a first terminal electrically connected to both the TES radiofrequency supply cable 407 and the TES radiofrequency signal supply conductor 409, and the capacitor 408 has a second terminal electrically connected to the reference ground potential. In some embodiments, the capacitor 408 is a variable capacitor. In some embodiments, the capacitor 408 is a fixed capacitor. In some embodiments, the capacitor 408 is set to have a capacitance within a range extending from about 10 picoFarads to about 100 picoFarads. The TES radiofrequency supply cable 407 is connected to a TES impedance matching system 401. The TES impedance matching system 401 is connected to a TES radiofrequency signal generator 403. Radiofrequency signals generated by the TES radiofrequency signal generator 403 are transmitted through the TES impedance matching system 401 to the TES radiofrequency supply cable 407, then to the TES radiofrequency signal supply conductor 409, then through the TES radiofrequency signal filters 411 to the respective TES radiofrequency signal supply pins 413, and to the TES electrode 415 within the coupling ring 161. In some embodiments, the TES radiofrequency signal generator 403 is configured and operated to generate radiofrequency signals within a frequency range extending from about 50 kiloHertz to about 27 MHz. In some embodiments, the TES radiofrequency signal generator 403 supplies radiofrequency power within a range extending from about 50 Watts to about 10 kiloWatts. The TES radiofrequency signal generator 403 is also connected to the control system 120 through one or more signal conductors 405.

Figure 3:
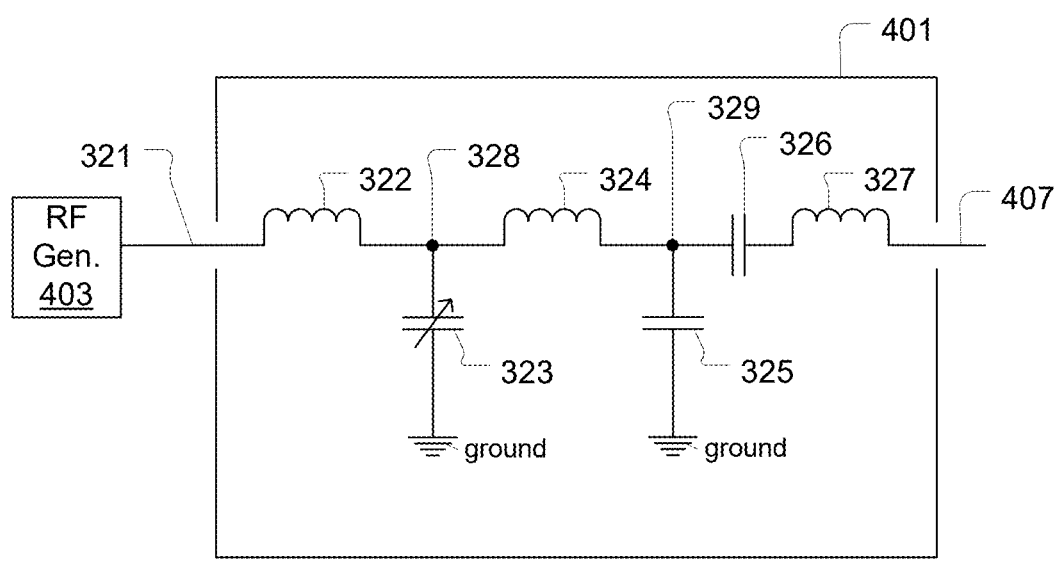
FIG. 3 shows an example electrical schematic of the TES impedance matching system, in accordance with some embodiments.

The TES impedance matching system 401 includes an arrangement of inductors and capacitors sized and connected to provide for impedance matching so that radiofrequency power can be transmitted from the TES radiofrequency signal generator 403 along the TES radiofrequency supply cable 407, along the TES radiofrequency signal supply conductor 409, through the TES radiofrequency signal filters 411, through the respective TES radiofrequency signal supply pins 413, to the TES electrode 415 within the coupling ring 161, and into the plasma processing region 182 above the edge ring 167. FIG. 3 shows an example electrical schematic of the TES impedance matching system 401, in accordance with some embodiments. The TES impedance matching system 401 includes an input line 321 electrically connected to the TES radiofrequency signal generator 403. The TES input line 321 is electrically connected to an input terminal of a first inductor 322. An output terminal of the first inductor 322 is electrically connected to an internal node 328. A second inductor 324 has an input terminal electrically connected to the internal node 328. An output terminal of the second inductor 324 is electrically connected to a second internal node 329. A first capacitor 326 has an input terminal electrically connected to the second internal node 329. An output terminal of the first capacitor 326 is electrically connected to an input terminal of a third inductor 327. An output terminal of the third inductor 327 is electrically connected to the TES radiofrequency supply cable 407. Also, a second capacitor 323 has an input terminal electrically connected to the first internal node 328. The second capacitor 323 has an output terminal electrically connected to a reference ground potential. In some embodiments, the second capacitor 323 is a variable capacitor. Also, a third capacitor 325 has an input terminal electrically connected to the second internal node 329. The third capacitor 325 has an output terminal electrically connected to a reference ground potential. It should be understood that the electrical configuration of the TES impedance matching system 401 as shown in FIG. 3 is provided by way of example. In other embodiments, the TES impedance matching system 401 can have a configuration of inductors and/or capacitors that is different from the example shown in FIG. 3. The TES impedance matching system 401 is also connected to the control system 120 through one or more signal conductors 404.

By transmitting radiofrequency signals/power through the TES electrode 415 disposed (embedded) within the coupling ring 161, the TES system is capable of controlling characteristics of the plasma 180 near the peripheral edge of the wafer W. For example, in some embodiments, the TES system is operated to control the plasma 180 sheath properties near the edge ring 167, such as by controlling a shape of the plasma 180 sheath and/or by controlling a size (either increase in sheath thickness or decrease in sheath thickness). Also, in some embodiments, by controlling the shape of the plasma 180 sheath near the edge ring 167, it is possible to control various properties of the bulk plasma 180 over the wafer W. Also, in some embodiments, the TES system is operated to control a density of the plasma 180 near the edge ring 167. For example, in some embodiments, the TES system is operated to either increase or decrease the density of the plasma 180 near the edge ring 167. Also, in some embodiments, the TES system is operated to control a bias voltage present on the edge ring 167, which in turn controls/influences movement of ions and other charged constituents within the plasma 180 near the edge ring 167. For example, in some embodiments, the TES system is operated to control a bias voltage present on the edge ring 167 to attract more ions from the plasma 180 toward the edge of the wafer W. And, in some embodiments, the TES system is operated to control a bias voltage present on the edge ring 167 to repel ions from the plasma 180 away from the edge of the wafer W. It should be understood that the TES system can be operated to perform a variety of different functions, such as those mentioned above, among others, either separately or in combination.

In some embodiments, the coupling ring 161 is formed of a dielectric material, such as quartz, or ceramic, or alumina ($Al_2O_3$), or a polymer, among others.

A bottom surface of the edge ring 167 has a portion that is coupled to the upper surface of the coupling ring 161 through a layer of thermally and electrically conductive gel to thermally sink the coupling ring 161 to the edge ring 167. Also, the bottom surface of the edge ring 167 has another portion that is coupled to an upper surface of the electrode 109 through a layer of thermally and electrically conductive gel. Examples of the thermally and electrically conductive gel include polyimide, polyketone, polyetherketone, polyether sulfone, polyethylene terephthalate, fluoroethylene propylene copolymers, cellulose, triacetates, and silicone, among others. In some embodiments, the thermally and electrically conductive gel is formed as a double-sided tape. In some embodiments, the edge ring 167 has an inner diameter sized to be proximate to the outer diameter of the ceramic layer 110.

In various embodiments, the TES electrode 415 is formed of an electrically conductive material, such as platinum, steel, aluminum, or copper, among others. During operation, capacitive coupling occurs between the TES electrode 415 and the edge ring 167, such that the edge ring 167 is electrically powered to influence processing of the wafer W near the outer perimeter of the wafer W.

Figure 4:
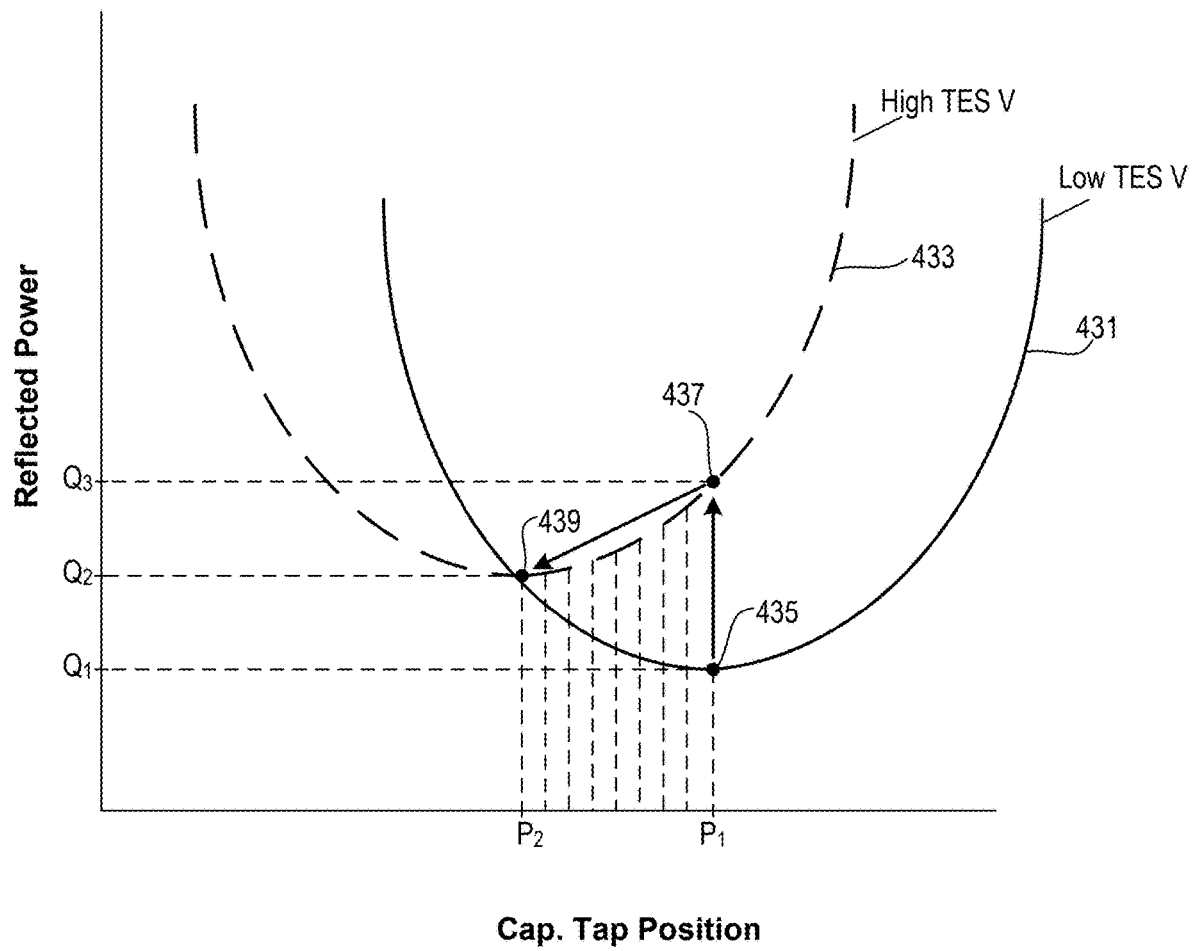
FIG. 4 is a graph showing the relationship between reflected power and capacitor tap position in the TES impedance matching system 401, in accordance with some embodiments.

FIG. 4 is a graph showing the relationship between reflected power and capacitor tap position in the TES impedance matching system 401, in accordance with some embodiments. As noted previously, the voltage applied to the TES electrode 415 is increased to compensate for wear of the edge ring 167, thereby maintaining the position of the plasma sheath at the wafer W's edge. However, increasing the voltage applied to the TES electrode 415 changes the impedance of the system, and results in increased reflection of radiofrequency power. In order to minimize reflected radiofrequency power, a capacitance setting in the TES impedance matching system 401 can be adjusted, specifically by changing a capacitor tap position of the variable capacitor 323.

As shown in the illustrated graph, reflected power (i.e., gamma) as a function of capacitor tap position for a first (lower) voltage, applied by the TES RF signal generator 403 to the TES electrode 415, is shown by the curve 431. As indicated, the reflected power is minimized when the capacitor tap position is set to a position P1, corresponding to a point 435 along the curve 431, and having a reflected power Q1.

However, when the voltage is increased to a second (higher) voltage, to compensate for wear of the edge ring 167, then the reflected power as a function of capacitor tap position is represented by the curve 433. As a result, if the capacitor tap position remains unchanged at position P1, then the reflected power increases from Q1 to Q3, corresponding to the point 437 along the curve 433.

Thus, in order to minimize reflected power in the system, the capacitor tap position is adjusted to a position P2, where the reflected power is minimized, corresponding to point 439 along the curve 433. In this manner, the reflected power is reduced from Q3 to Q2.

In some implementations, the capacitor tap position is adjusted in stepwise increments until reflected power is minimized. For example, the capacitor tap position can be sequentially adjusted in a direction that reduces reflected power until further changes no longer provide further reductions in reflected power. For example, the capacitor tap position may be stepwise adjusted and the reflected power determined/monitored at each adjustment, as the reflected power decreases, reaches a minimum, and then starts to increase. The capacitor tap position can then be set to the position corresponding to the minimum reflected power. In some implementations, a target minimum reflected power is pre-determined, and the capacitor tap position is adjusted in a stepwise manner, checking after each adjustment, until the target minimum reflected power is achieved. It should be understood that the target minimum reflected power may or may not be the same as the actual minimum reflected power.

Figure 5:
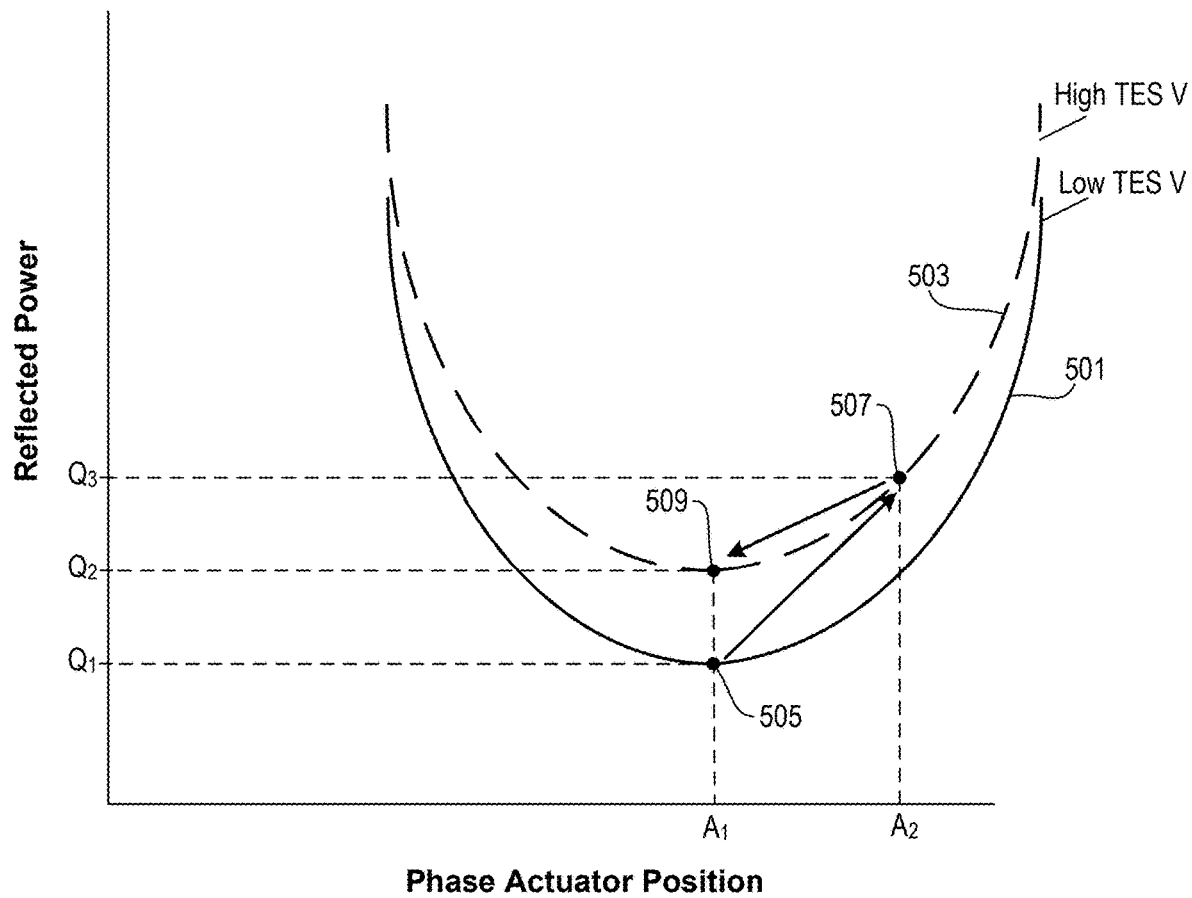
FIG. 5 is a graph showing reflected power versus phase actuator position of the TES RF signal generator 403, in accordance with some embodiments.

FIG. 5 is a graph showing reflected power versus phase actuator position of the TES RF signal generator 403, in accordance with some embodiments. The phase actuator position indicates the amount of phase adjustment/offset performed automatically by the TES RF signal generator 403 in order to match phase with the RF signal produced by the first RF signal generator 147. As shown, for a first (lower) voltage applied by the TES RF signal generator 403, the reflected power (i.e., gamma) as a function of the phase actuator position (or phase offset or phase adjustment amount) is represented by the curve 501. Whereas, for a second (higher) voltage, the reflected power as a function of the phase actuator position (or phase offset or phase adjustment amount) is represented by the curve 503.

It has been discovered as an unexpected result that the reflected power is minimized at substantially the same phase offset even as the applied voltage changes. Therefore, the phase actuator position of the TES RF signal generator 403 can be utilized to optimize the capacitor tap position of the impedance matching system 401, as described above, to minimize reflected power.

With reference to both of the graphs of FIGS. 4 and 5, when the capacitor tap position is at P1, and the first (lower) voltage is applied, then the phase actuator position is automatically set at an amount (angular amount) A1 to minimize the phase delta. The capacitor tap position P1 has been set previously to minimize reflected power as indicated by the point 435, and this corresponds to a point 505 along the curve 501. As can be seen, at the point 505, the reflected power is minimized consistent with the curve 501 and also consistent with the curve 431.

When the voltage is increased to a second (higher) voltage to compensate for edge wear, then the reflected power versus phase actuator position curve shifts to curve 503. However, if the capacitor tap position is unchanged and remains at P1, then the phase actuator position is automatically adjusted by the TES RF signal generator 403 to an amount A2, as a result of the TES RF signal generator 403 automatically matching the phase of its RF signal to the RF signal of the first RF signal generator 147, which requires a different phase offset due to the change in voltage and resulting change in impedance. Accordingly, the change in voltage causes the system to move from point 505 along curve 501 to point 507 along curve 503, which is the curve describing reflected power versus phase actuator position at the second (higher) voltage that is employed to compensate for edge wear. Point 507 along curve 503 corresponds to the point 437 along curve 433 previously described. At these points, prior to adjustment of the capacitor tap position, the reflected power is increased to Q3.

Then, in order to minimize reflected power, the capacitor tap position of the variable capacitor 323 of the TES impedance matching system 401 is adjusted to position P2 as previously described. In an unexpected result, this causes the phase actuator position of the TES RF signal generator 403 to return to A1, as the TES RF signal generator 403 automatically adjusts the phase of its RF signal to match that of the first RF signal generator 147. This is shown in the illustrated graph as a movement along curve 503 from point 507 to point 509, at which the reflected power is minimized to Q2. It will be appreciated that the point 509 along curve 503 corresponds to point 439 along curve 433.

Figure 6:
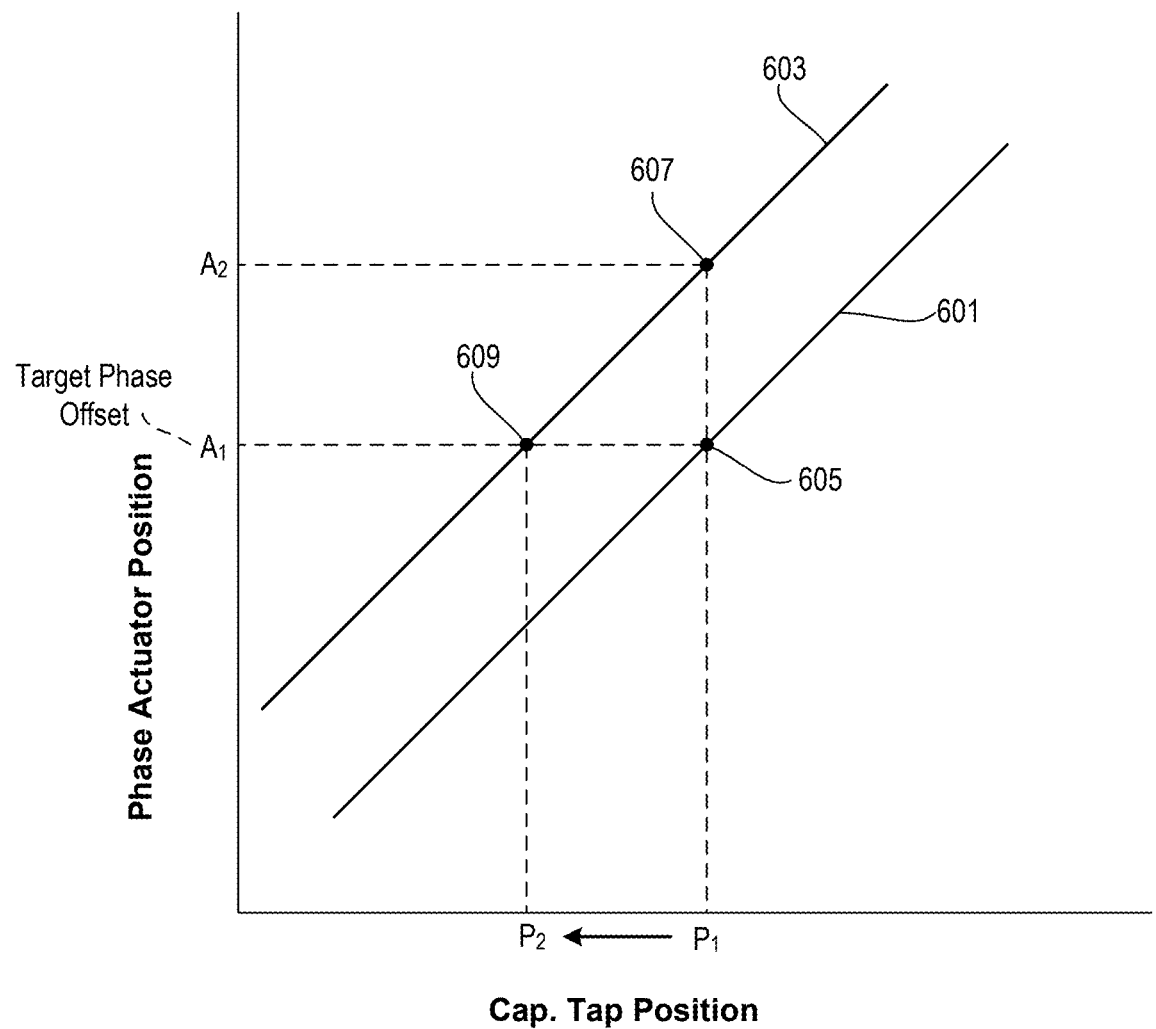
FIG. 6 is a graph showing phase actuator position versus capacitor tap position, in accordance with some embodiments.

Accordingly, in view of the above, the phase offset applied by the TES RF signal generator 403 can be monitored and utilized to adjust the capacitor tap position of the variable capacitor 323 of the TES RF signal generator 401. FIG. 6 is a graph showing phase actuator position versus capacitor tap position, in accordance with some embodiments. The curve 601 shows the phase actuator position (which is automatically set to match phase as previously described) versus capacitor tap position, when a first (lower) voltage is applied. Curve 603 shows the phase actuator position versus capacitor tap position, when a second (higher) voltage is applied.

Under the first voltage condition, the capacitor tap position is set at P1, and the phase actuator position is automatically set to A1, which defines a target phase offset. This condition is indicated by the point 605 along the curve 601. When the second voltage condition is applied, entailing increased voltage to compensate for edge ring wear, then the phase actuator position shifts to A2, as the current state is now represented by point 607 along curve 603. Thus, to minimize reflected power under the new increased voltage condition, the capacitor tap position is adjusted until the phase actuator position reaches A1, which is the target phase offset.

For example, the capacitor tap position can be adjusted in stepwise increments from P1 to P2, checking the phase actuator position with each change, until the target phase offset A1 is achieved again, represented at point 609 along the curve 603. Knowing that the reflected power is minimized at the phase actuator position A1, then the capacitor tap position is adjusted until the phase actuator position reaches A1. In some implementations, the phase actuator position, or target phase offset for a given recipe is in the range of about 80 to 230 degrees; in some implementations, in the range of about 110-170 degrees; in some implementations, in the range of about 140 to 160 degrees.

Figure 7:
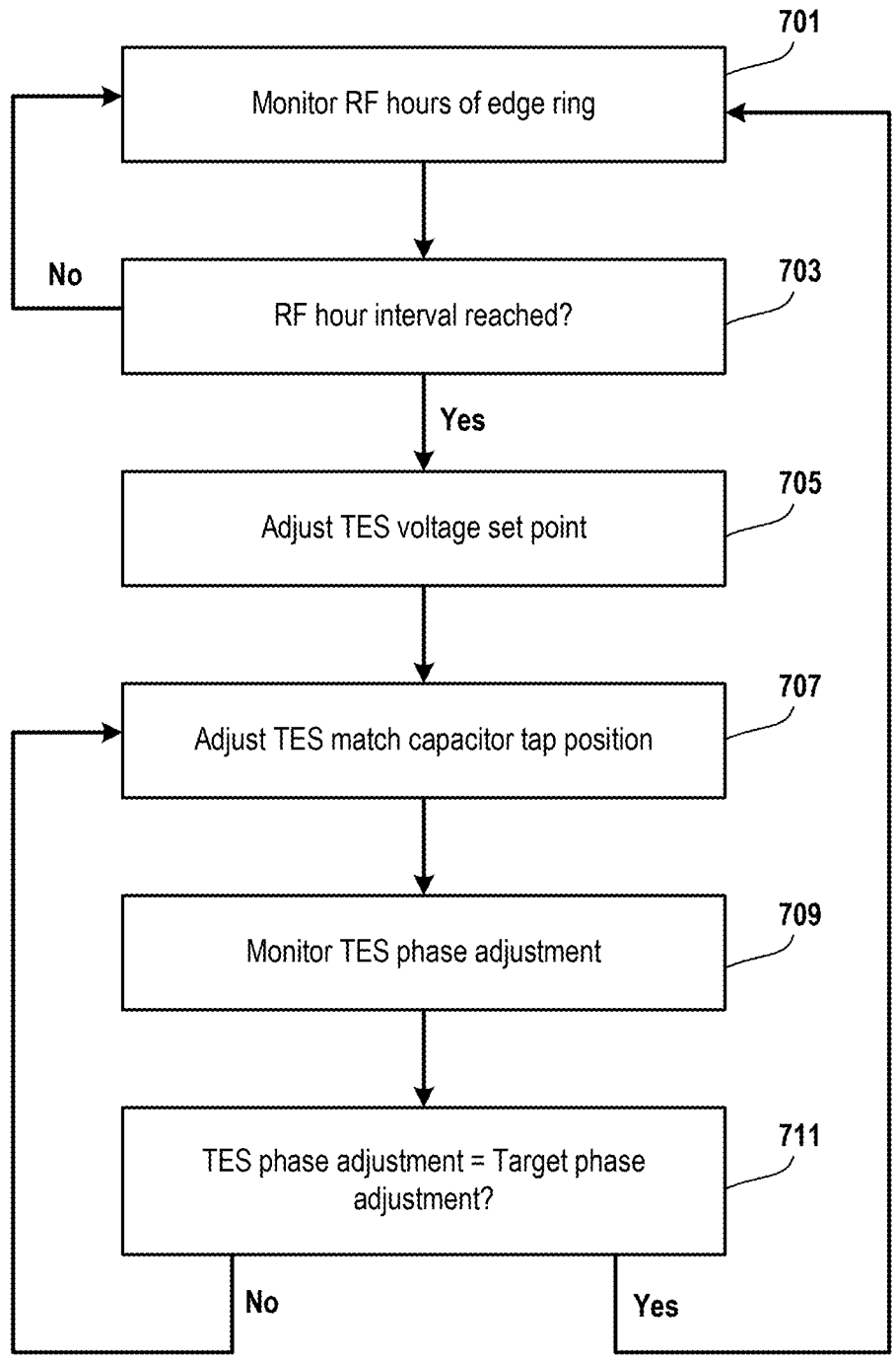
FIG. 7 illustrates a method for optimizing TES match capacitor tap position to minimize reflected power (i.e., gamma) in view of changing TES voltage setpoint to compensate for edge ring wear, in accordance with implementations of the disclosure.

FIG. 7 illustrates a method for optimizing TES match capacitor tap position to minimize reflected power (i.e., gamma) in view of changing TES voltage setpoint to compensate for edge ring wear, in accordance with implementations of the disclosure. At method operation 701 the method initiates with monitoring the number of RF hours experienced by an edge ring. At method operation 703, it is determined if a predefined or target RF hour interval has been reached. For example, the system can be configured to adjust the TES voltage setpoint (the target voltage output by the TES RF signal generator 403) at regular intervals based on the number of hours of RF exposure (RF hours) accrued to the edge ring, either since installation or since the previous change in the TES voltage setpoint. Thus, the RF hour interval can be defined to determine when and how frequently the TES voltage setpoint will be adjusted to compensate for edge ring wear. By way of example, without limitation, in some implementations, the RF hour interval is in the range of about 10 to 200 RF hours. In some implementations, the RF hour interval is about 100 RF hours.

In some implementations, the RF hour interval is consistent, having a single value throughout the lifetime of the edge ring. Whereas, in some implementations, the RF hour interval has different values that change from one interval to the next, over the course of the edge ring lifetime. For example, in some implementations, more frequent changes to the TES voltage setpoint are desirable as the edge ring wears, and thus the RF hour interval decreases as total RF hours accrue during the edge ring lifetime. In some implementations, a successive RF hour interval is less than a preceding RF hour interval during at least a portion of the edge ring lifetime.

In some implementations, the target RF hour interval can be specified via a user interface. For example, there can be a default target RF hour interval (e.g. 50 to 100 RF hours in some implementations), which can be adjusted by the user in predefined increments (e.g. 1 to 10 RF hour increments in some implementations) and within a predefined range (e.g. a range of 1 to 400 RF hours in some implementations). Furthermore, a user-defined function can be set through the user interface to determine the relationship of the voltage compensation offset (additional TES voltage above the initial setpoint) as a function of the number of RF hours accrued. For example, in some implementations the user can enter voltage compensation offset values for specific RF hour values, and the system can be configured to automatically define a function that includes these points, e.g. by linearly interpolating between points. Then, for any given number of RF hours accrued (which can be according to a target RF hour interval), the system can determine the appropriate voltage compensation offset according to the function.

If the target RF hour interval has not been reached, then the method returns to method operation 701.

If the target RF hour interval has been reached, then the method proceeds to method operation 705, wherein the TES voltage setpoint is adjusted to compensate for edge ring wear. Typically, this entails increasing the TES voltage setpoint.

At method operation 707, the capacitor tap position of the TES impedance matching system 401 is adjusted, to reduce or minimize reflected power. At method operation 709, the TES phase adjustment is monitored, which is the phase adjustment automatically applied by the TES RF signal generator 403 in order to match its RF signal with, or produce zero phase delta with, the RF signal from the first RF signal generator 147.

At method operation 711, it is determined whether the TES phase adjustment is equal to, or within a predefined range of, a target phase adjustment. If not, then the method returns to method operation 707; if so, then the method returns to the start at method operation 701.

While in some implementations, the TES voltage setpoint is adjusted at predefined intervals, it will be appreciated that, in various implementations, the TES voltage setpoint can be adjusted at any interval or even continuously or substantially continuously, as a function of RF hours of the edge ring, number of process cycles, or any other monitored indicator of edge ring wear. Though in some implementations, the adjustments to the capacitance of the TES impedance matching system 401 have been described as occurring in discrete steps such as via stepwise adjustment of a capacitor tap position, it will be appreciated that the granularity of such adjustments are only limited by the capability of the variable capacitor's adjustment. In various implementations, the adjustments to the capacitance can be in discrete steps of any amount, or continuous or substantially continuous as permitted by the variable capacitor of the TES impedance matching system 401.

For a given recipe, there can be a target phase adjustment for each recipe step. Further, the target phase adjustment can be editable through the user interface, such as through a recipe editor of the user interface. There can be a default value for the target phase adjustment that is provided when a new recipe step is created. For example, there can be a model (based on empirical data) that predicts what the target phase adjustment should be for each recipe step. The user can have the option to choose to use this model when creating each recipe step or the user may enter their own value.

It will be appreciated that any of the methods described in the present disclosure can be implemented to run automatically by the control system 120. In some embodiments, capacitor tap position can be automatically optimized to minimize reflected power in the TES system, as has been described.

Figure 8:
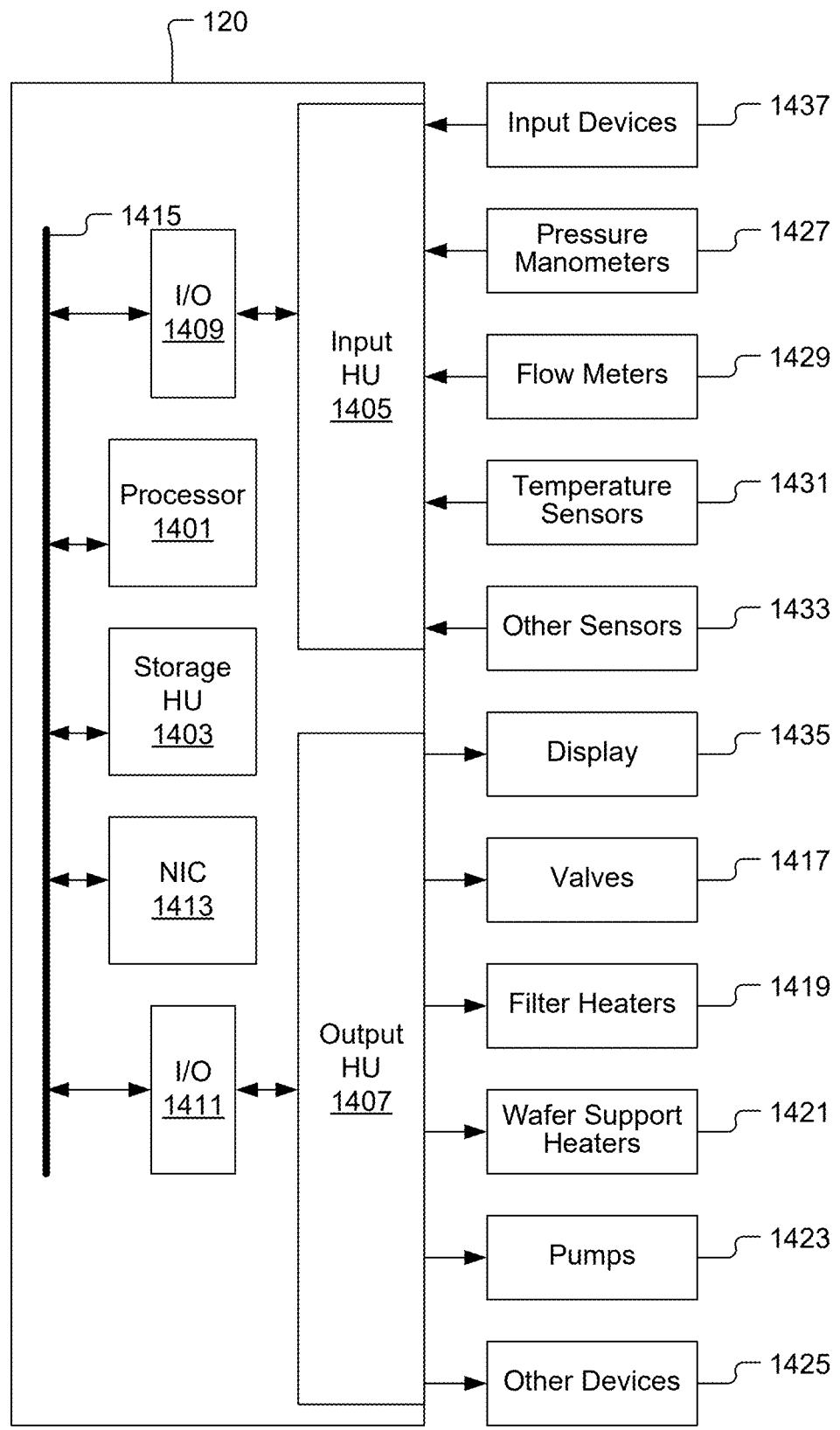
FIG. 8 shows an example schematic of the control system of FIG. 2, in accordance with some embodiments.

FIG. 8 shows an example schematic of the control system 120 of FIG. 2, in accordance with some embodiments. In some embodiments, the control system 120 is configured as a process controller for controlling the semiconductor fabrication process performed in plasma processing system 100. In various embodiments, the control system 120 includes a processor 1401, a storage hardware unit (HU) 1403 (e.g., memory), an input HU 1405, an output HU 1407, an input/output (I/O) interface 1409, an I/O interface 1411, a network interface controller (NIC) 1413, and a data communication bus 1415. The processor 1401, the storage HU 1403, the input HU 1405, the output HU 1407, the I/O interface 1409, the I/O interface 1411, and the NIC 1413 are in data communication with each other by way of the data communication bus 1415. The input HU 1405 is configured to receive data communication from a number of external devices. Examples of the input HU 1405 include a data acquisition system, a data acquisition card, etc. The output HU 1407 is configured to transmit data to a number of external devices. An examples of the output HU 1407 is a device controller. Examples of the NIC 1413 include a network interface card, a network adapter, etc. Each of the I/O interfaces 1409 and 1411 is defined to provide compatibility between different hardware units coupled to the I/O interface. For example, the I/O interface 1409 can be defined to convert a signal received from the input HU 1405 into a form, amplitude, and/or speed compatible with the data communication bus 1415. Also, the I/O interface 1407 can be defined to convert a signal received from the data communication bus 1415 into a form, amplitude, and/or speed compatible with the output HU 1407. Although various operations are described herein as being performed by the processor 1401 of the control system 120, it should be understood that in some embodiments various operations can be performed by multiple processors of the control system 120 and/or by multiple processors of multiple computing systems in data communication with the control system 120.

In some embodiments, the control system 120 is employed to control devices in various wafer fabrication systems based in-part on sensed values. For example, the control system 120 may control one or more of valves 1417, filter heaters 1419, wafer support structure heaters 1421, pumps 1423, and other devices 1425 based on the sensed values and other control parameters. The valves 1417 can include valves associated with control of the backside gas supply system 129, the process gas supply system 191, and the temperature control fluid circulation system 125. The control system 120 receives the sensed values from, for example, pressure manometers 1427, flow meters 1429, temperature sensors 1431, and/or other sensors 1433, e.g., voltage sensors, current sensors, etc. The control system 120 may also be employed to control process conditions within the plasma processing system 100 during performance of plasma processing operations on the wafer W. For example, the control system 120 can control the type and amounts of process gas(es) supplied from the process gas supply system 191 to the plasma processing region 182. Also, the control system 120 can control operation of the first radiofrequency signal generator 147, the second radiofrequency signal generator 149, the impedance matching system 143, the TES radiofrequency signal generator 403, and the TES impedance matching system 401. Also, the control system 120 can control operation of the DC supply 117 for the clamping electrode(s) 112. The control system 120 can also control operation of the lifting devices 133 for the lift pins 132 and operation of the door 107. The control system 120 also controls operation of the backside gas supply system 129 and the temperature control fluid circulation system 125. The control system 120 also control vertical movement of the cantilever arm assembly 115. The control system 120 also controls operation of the throttle member 196 and the pump that controls suction at the exhaust port 105. The control system 120 also controls operation of the hold-down control mechanisms 913 of the hold-down rods 911 of the TES system 1000. The control system 120 also receives input from the temperature probe of the TES system 1000. It should be understood that the control system 120 is equipped to provide for programmed and/or manual control any function within the plasma processing system 100.

In some embodiments, the control system 120 is configured to execute computer programs including sets of instructions for controlling process timing, process gas delivery system temperature, and pressure differentials, valve positions, mixture of process gases, process gas flow rate, backside cooling gas flow rate, chamber pressure, chamber temperature, wafer support structure temperature (wafer temperature), RF power levels, RF frequencies, RF pulsing, impedance matching system 143 settings, cantilever arm assembly position, bias power, and other parameters of a particular process. Other computer programs stored on memory devices associated with the control system 120 may be employed in some embodiments. In some embodiments, there is a user interface associated with the control system 120. The user interface include a display 1435 (e.g., a display screen and/or graphical software displays of the apparatus and/or process conditions), and user input devices 1437 such as pointing devices, keyboards, touch screens, microphones, etc.

Software for directing operation of the control system 120 may be designed or configured in many different ways. Computer programs for directing operation of the control system 120 to execute various wafer fabrication processes in a process sequence can be written in any conventional computer readable programming language: for example, assembly language, C, C++, Pascal, Fortran or others. Compiled object code or script is executed by the processor 1401 to perform the tasks identified in the program. The control system 120 can be programmed to control various process control parameters related to process conditions such as, for example, filter pressure differentials, process gas composition and flow rates, backside cooling gas composition and flow rates, temperature, pressure, plasma conditions, such as RF power levels and RF frequencies, bias voltage, cooling gas/fluid pressure, and chamber wall temperature, among others. Examples of sensors that may be monitored during the wafer fabrication process include, but are not limited to, mass flow control modules, pressure sensors, such as the pressure manometers 1427 and the temperature sensors 1431. Appropriately programmed feedback and control algorithms may be used with data from these sensors to control/adjust one or more process control parameters to maintain desired process conditions.

In some implementations, the control system 120 is part of a broader fabrication control system. Such fabrication control systems can include semiconductor processing equipment, including a processing tools, chambers, and/or platforms for wafer processing, and/or specific processing components, such as a wafer pedestal, a gas flow system, etc. These fabrication control systems may be integrated with electronics for controlling their operation before, during, and after processing of the wafer. The control system 120 may control various components or subparts of the fabrication control system. The control system 120, depending on the wafer processing requirements, may be programmed to control any of the processes disclosed herein, including the delivery of processing gases, the delivery of backside cooling gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the control system 120 may be defined as electronics having various integrated circuits, logic, memory, and/or software that receive instructions, issue instructions, control operation, enable wafer processing operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the control system 120 in the form of various individual settings (or program files), defining operational parameters for carrying out a particular process on the wafer W within system 100. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The control system 120, in some implementations, may be a part of or coupled to a computer that is integrated with, coupled to the plasma processing system 100, or otherwise networked to the system 100, or a combination thereof. For example, the control system 120 may be in the "cloud" of all or a part of a fab host computer system, which can allow for remote access of the wafer processing. The computer may enable remote access to the system 100 to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to the system 100 over a network, which may include a local network or the Internet.

The remote computer may include a user interface that enables entry or programming of parameters and/or settings, which are then communicated to the system 100 from the remote computer. In some examples, the control system 120 receives instructions in the form of data, which specify parameters for each of the processing steps to be performed during one or more operations. It should be understood that the parameters may be specific to the type of process to be performed within the plasma processing system 100. Thus as described above, the control system 120 may be distributed, such as by comprising one or more discrete controllers that are networked together and working towards a common purpose, such as the processes and controls described herein. An example of a distributed controller for such purposes would be one or more integrated circuits on the plasma processing system 100 in communication with one or more integrated circuits located remotely (such as at the platform level or as part of a remote computer) that combine to control a process performed on the plasma processing system 100.

Without limitation, example systems that the control system 120 can interface with may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. As noted above, depending on the process step or steps to be performed by the tool, the control system 120 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Embodiments described herein may also be implemented in conjunction with various computer system configurations including hand-held hardware units, microprocessor systems, microprocessor-based or programmable consumer electronics, minicomputers, mainframe computers and the like. Embodiments described herein can also be implemented in conjunction with distributed computing environments where tasks are performed by remote processing hardware units that are linked through a network. It should be understood that the embodiments described herein, particularly those associated with the control system 120, can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be implemented through process control instructions instantiated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

The invention claimed is:

1. A method for controlling reflected power in a plasma processing system, comprising:
    applying radio frequency (RF) power from a first generator to an electrostatic chuck (ESC);
    applying RF power from a second generator to an edge electrode that surrounds the ESC and is disposed below an edge ring that surrounds the ESC, the RF power from the second generator having a voltage that is set based on an amount of use of the edge ring, wherein the second generator automatically introduces a phase adjustment so that a phase of the RF power from the second generator substantially matches a phase of the RF power from the first generator; and
    adjusting a variable capacitor of a match circuit through which the RF power from the second generator is applied to tune the phase adjustment to a target phase adjustment setting, wherein the phase of the RF power from the second generator is automatically adjusted to match the phase of the RF power from the first generator while the variable capacitor is adjusted, such that the phase adjustment is constantly changing; and
    monitoring the phase adjustment to determine when the phase adjustment is substantially equal to the target phase adjustment setting indicating that the phase adjustment is tuned to the target phase adjustment setting such that a reflected power in response to the voltage of the RF power from the second generator is minimized,
    wherein the target phase adjustment setting is an initial phase adjustment applied to an initial phase of an initial RF power from the second generator, having an initial voltage, to match an initial phase of an initial RF power from the first generator and when an initial reflected power is minimized,
    wherein the variable capacitor is adjusted to an initial value such that the initial reflected power is minimized when applying the initial RF power from the first generator and the initial RF power at the initial voltage from the second generator at an initial point of use of the edge ring that is before the edge ring has been subjected to the amount of use.

2. The method of claim 1, further comprising:
    determining the amount of use of the edge ring; and
    if the amount of use of the edge ring reaches a target level, initiating adjusting the variable capacitor of the match circuit.

3. The method of claim 2,
    wherein the target level and the target phase adjustment setting are captured via a user interface.

4. The method of claim 3,
wherein the target level is defined by a number of hours.

5. The method of claim 1,
wherein the target phase adjustment setting defines a predefined phase adjustment amount by which the phase of the RF power from the second generator is adjusted.

6. The method of claim 1,
wherein the adjusting the variable capacitor to tune the phase adjustment includes performing stepwise tap adjustments to the variable capacitor until the phase adjustment has reached the target phase adjustment setting.

7. The method of claim 1,
wherein the phase adjustment is tuned to the target phase adjustment setting when the phase adjustment reaches the target phase adjustment setting or the phase adjustment is within a predefined range of the target phase adjustment setting.

8. The method of claim 1,
wherein adjusting the variable capacitor to tune the phase adjustment to the target phase adjustment setting minimizes reflection of the RF power to the second generator.

9. The method of claim 1,
wherein the target phase adjustment setting to minimize reflection of the RF power to the second generator remains substantially the same for changes in the voltage from the second generator.

10. The method of claim 1,
wherein the amount of use of the edge ring is defined by at least one of a number of hours of RF exposure of the edge ring and the voltage of the RF power from the second generator that is set based on the number of hours of RF exposure.

11. A method for minimizing reflected power in a plasma processing system, comprising:
applying radio frequency (RF) power from a first generator to an electrostatic chuck (ESC);
applying RF power from a second generator to an edge electrode that surrounds the ESC, the RF power from the second generator having a voltage that is set at a predefined first voltage, wherein the second generator introduces a phase adjustment at a predefined phase adjustment amount so that a phase of the RF power from the second generator substantially matches a phase of the RF power from the first generator when the reflected power is minimized, wherein a capacitance of a match circuit, through which the RF power from the second generator is applied, is initially adjusted to an initial value to minimize the reflected power when applying the RF power from the first generator and the RF power from the second generator at an initial point of use of an edge ring;
changing the voltage of the RF power from the second generator from the predefined first voltage to a predefined second voltage based on an amount of use of the edge ring, wherein changing the voltage causes the phase adjustment to automatically change from the predefined phase adjustment amount; and
responsive to changing the voltage to the predefined second voltage, adjusting the capacitance of the match circuit to return the phase adjustment that has been changed back to the predefined phase adjustment amount such that a reflected power in response to the RF power from the second generator is minimized, wherein the phase of the RF power from the second generator is automatically adjusted to match the phase of the RF power from the first generator while the capacitance of the match circuit is adjusted.

12. The method of claim 11, further comprising:
determining the amount of use of an edge ring that is disposed on top of the edge electrode and surrounds the ESC; and
if the amount of use of the edge ring reaches a target level, initiating changing the voltage of the RF power from the second generator.

13. The method of claim 12,
wherein the target level and the predefined phase adjustment amount are captured via a user interface.

14. The method of claim 13,
wherein the target level is defined by a number of hours.

15. The method of claim 11,
wherein the adjusting the capacitance of the match circuit includes performing stepwise tap adjustments to the capacitance until the changed phase adjustment has reached the predefined phase adjustment amount.

16. The method of claim 11,
wherein the phase adjustment is returned to the predefined phase adjustment amount when the phase adjustment reaches the predefined phase adjustment amount or the phase adjustment is within a predefined range of the predefined phase adjustment amount.

17. The method of claim 11,
wherein adjusting the capacitance to return the phase adjustment to the predefined phase adjustment amount minimizes the reflected power to the second generator.

18. The method of claim 11,
wherein the predefined phase adjustment amount that minimizes the reflected power to the second generator remains substantially the same for changes in the voltage from the second generator.

19. The method of claim 18,
wherein the amount of use of the edge ring is defined by at least one of a number of hours of RF exposure of the edge ring and the voltage of the RF power from the second generator that is changed to the predefined second voltage is set based on the number of hours of RF exposure.

* * * * *